United States Patent
Snelgrove et al.

(10) Patent No.: US 7,474,149 B2
(45) Date of Patent: Jan. 6, 2009

(54) RADIO FREQUENCY POWER AMPLIFIER AND METHOD USING A CONTROLLED SUPPLY

(75) Inventors: William Martin Snelgrove, Toronto (CA); Kelly M. Mekechuk, Austin, TX (US)

(73) Assignee: PulseWave RF, Inc., Austin, TX (US)

( * ) Notice: Subject to any disclaimer, the term of this patent is extended or adjusted under 35 U.S.C. 154(b) by 0 days.

(21) Appl. No.: 11/818,925

(22) Filed: Jun. 15, 2007

(65) Prior Publication Data

US 2007/0249304 A1 Oct. 25, 2007

Related U.S. Application Data

(63) Continuation-in-part of application No. 11/413,999, filed on Apr. 28, 2006, which is a continuation-in-part of application No. 11/089,834, filed on Mar. 25, 2005, now Pat. No. 7,352,237.

(60) Provisional application No. 60/814,341, filed on Jun. 16, 2006.

(51) Int. Cl.
*H03G 3/20* (2006.01)
(52) U.S. Cl. .................... 330/136; 330/129
(58) Field of Classification Search .......... 330/136, 330/129, 297, 207 P, 298; 327/307
See application file for complete search history.

(56) References Cited

U.S. PATENT DOCUMENTS

| | | | |
|---|---|---|---|
| 3,900,823 A | 8/1975 | Sokal et al. | |
| 3,919,656 A | 11/1975 | Sokal et al. | |
| 4,631,491 A | 12/1986 | Smithers | |
| 4,843,339 A | 6/1989 | Burt et al. | |
| 5,352,986 A | 10/1994 | Modgil et al. | |
| 5,420,536 A | 5/1995 | Faulkner et al. | |
| 5,777,512 A | 7/1998 | Tripathi et al. | |
| 5,886,572 A | 3/1999 | Myers et al. | |
| 5,974,089 A | 10/1999 | Tripathi et al. | |
| 6,121,910 A | 9/2000 | Khoury et al. | |
| 6,157,253 A | 12/2000 | Sigmon et al. | |
| 6,191,653 B1 | 2/2001 | Camp, Jr. et al. | |
| 6,373,334 B1 | 4/2002 | Melanson | |
| 6,518,838 B1 | 2/2003 | Risbo | |

(Continued)

OTHER PUBLICATIONS

J. Keyzer, et al., "Digital Generation of RF Signals for Wireless Communications With Band-Pass Delta-Sigma Modulation", 2001 IEEE MTT-S Digest pp. 2127-2130.

(Continued)

*Primary Examiner*—Henry K Choe
(74) *Attorney, Agent, or Firm*—Charles W. Bethards

(57) ABSTRACT

A radio frequency power amplifier includes a feedback control system coupled to an input signal and a first feedback signal and configured to provide an output; a controlled supply configured to provide power that is controlled in accordance with a signal; and a radio frequency gain stage powered from the controlled supply, driven by the output from the feedback control system, and configured to provide an output signal at the radio frequency to a resonant load, where the first feedback signal corresponds to the output signal. Some embodiments include a sequencer in the feedback control system and others utilize an additional feedback loop to control the power provided by the controlled supply.

34 Claims, 15 Drawing Sheets

U.S. PATENT DOCUMENTS

| | | | |
|---|---|---|---|
| 6,577,189 | B2 | 6/2003 | Jayaraman et al. |
| 6,600,369 | B2 * | 7/2003 | Mitzlaff ................. 330/149 |
| 6,630,899 | B2 | 10/2003 | Jayaraman |
| 6,864,668 | B1 | 3/2005 | McCune et al. |
| 7,113,035 | B2 * | 9/2006 | Koukkari et al. ............ 330/136 |
| 7,135,918 | B1 * | 11/2006 | Outaleb et al. ................ 330/10 |
| 7,276,966 | B1 * | 10/2007 | Tham et al. ................ 330/136 |
| 2004/0053595 | A1 | 3/2004 | Shinbo et al. |
| 2005/0032488 | A1 | 2/2005 | Pehike et al. |
| 2005/0052168 | A1 | 3/2005 | Tazawa et al. |
| 2005/0162144 | A1 | 7/2005 | Kernahan |
| 2005/0286278 | A1 | 12/2005 | Perreault et al. |

OTHER PUBLICATIONS

R. Schreier and M. Snelgrove, "Bandpass Sigma-Delta Modulation", Electronic Letters, Nov. 9, 1989, vol. 25. No. 23, pp. 1560-1561.

H. Balan, M. Declercq, "12v Class-D Amplifier in 5V CMOS Technology", 1995 IEEE Custom Integrated Circuits Conference, pp. 559-562.

Enrico Dallago and Gabriele Sassone, "Single-Cycle Quasi-Resonant Converters as Sigma-Delta Audio Power Stages", 1996 IEEE, pp. 645-650.

M.A.E. Andersen, "A New Application for Zero-Current-Switched Full-Wave Resonant Converters", 1993 The European Power Electronics Association, pp. 83-86.

Ion E. Opris and Gregory T. A. Kovacs, "A Video bandwidth Analog Median Circuit", IEEE 1995 Custom Integrated Circuits Conference pp. 555-558.

Glen Luckjiff, et al., "Interpolative Sigma Delta Modulators for High Frequency Power Electronic Applications", 1995 IEEE, pp. 444-449.

Mihai Albulet, RF Power Amplifiers, 2001, Noble Publishing, p. 269-270.

Hai Tao & John M. Khoury, "A 400-Ms/s Frequency Translating Bandpass Sigma-Delta Modulator", Dec. 1999, pp. 1741-1752.

Steven R. Norsworthy, Richard Schreier, Gagor C. Temes, "Delta-Sigma Data Converters" 1996, IEEE pp. 1-43.

Martin Snelgrove, "Intermediate-Function Synthesis", Dec. 1981, Department of Electrical Engineering University of Toronto. pp. 185-226.

Federic Gourgue "A Bandpass Subsampled Delta-Sigma Modulator for Narrowband Cellular Mobile Communications" pp. 353-356 1990.

Walter J.Chudobiak "Frequency and Power litiations of Class-D Transistor Amplifiers", IEEE Journal Feb. 1969 pp. 25-37.

Arun Jayaraman et al "Linear High-Efficiency Microwave Power Amplifiers Using Bandpass Delta-Sigma Modulators" IEEE Microwave vol. 8, Mar. 1998.

* cited by examiner

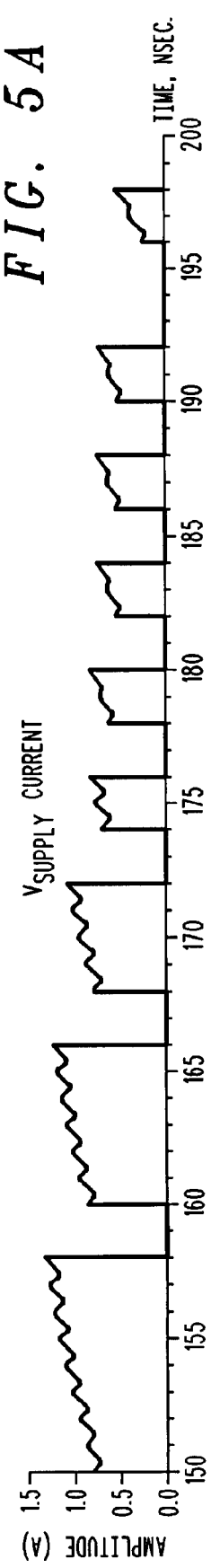
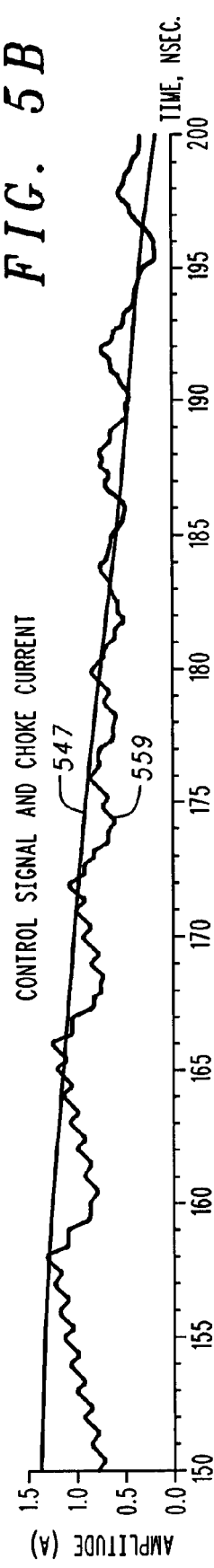
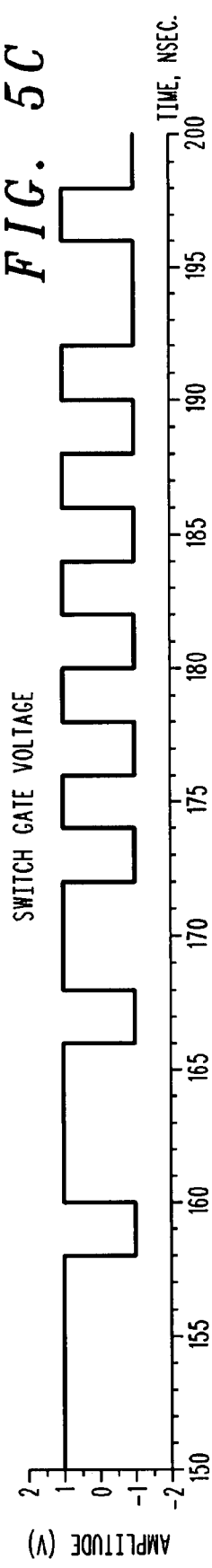
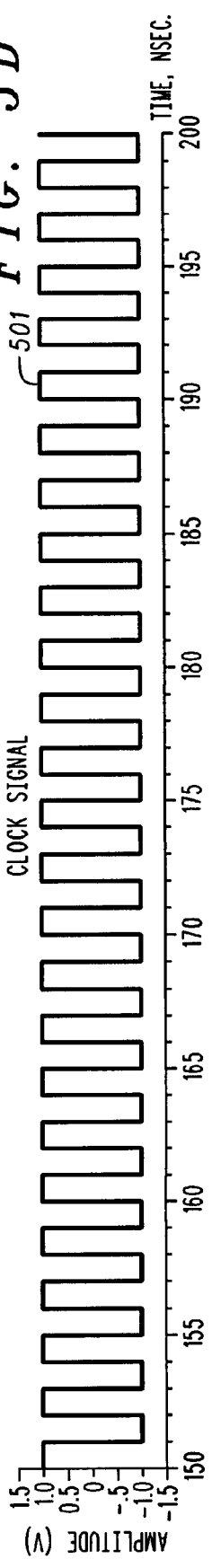

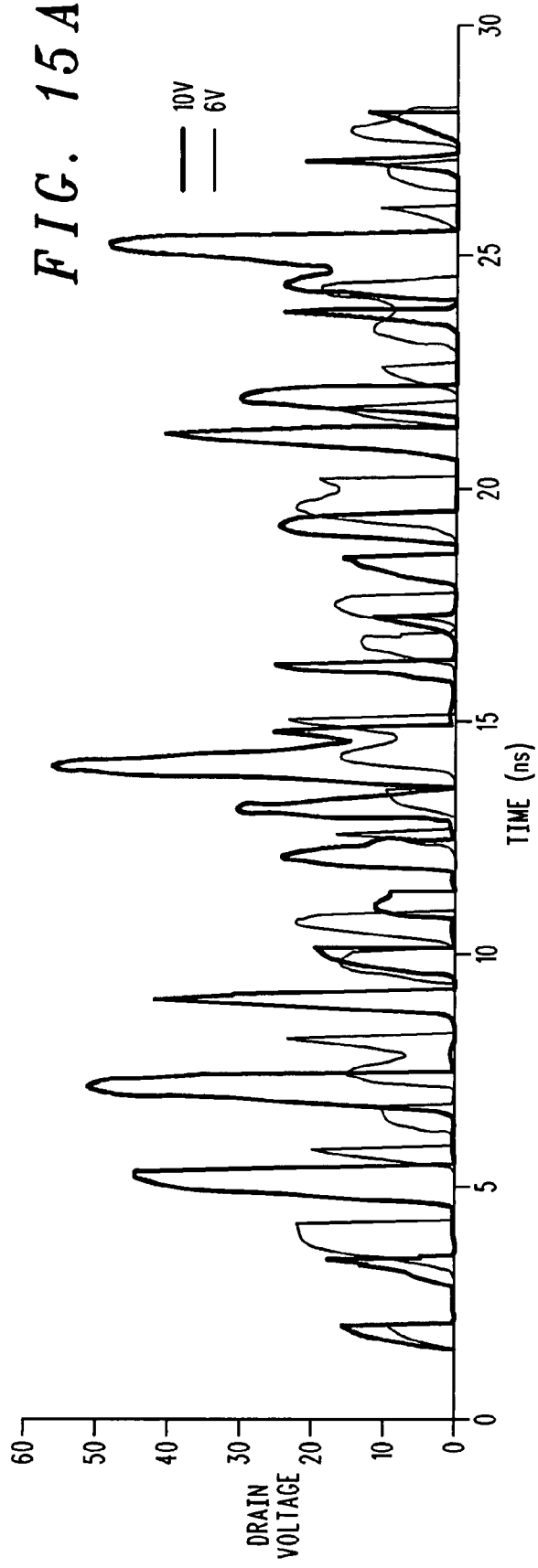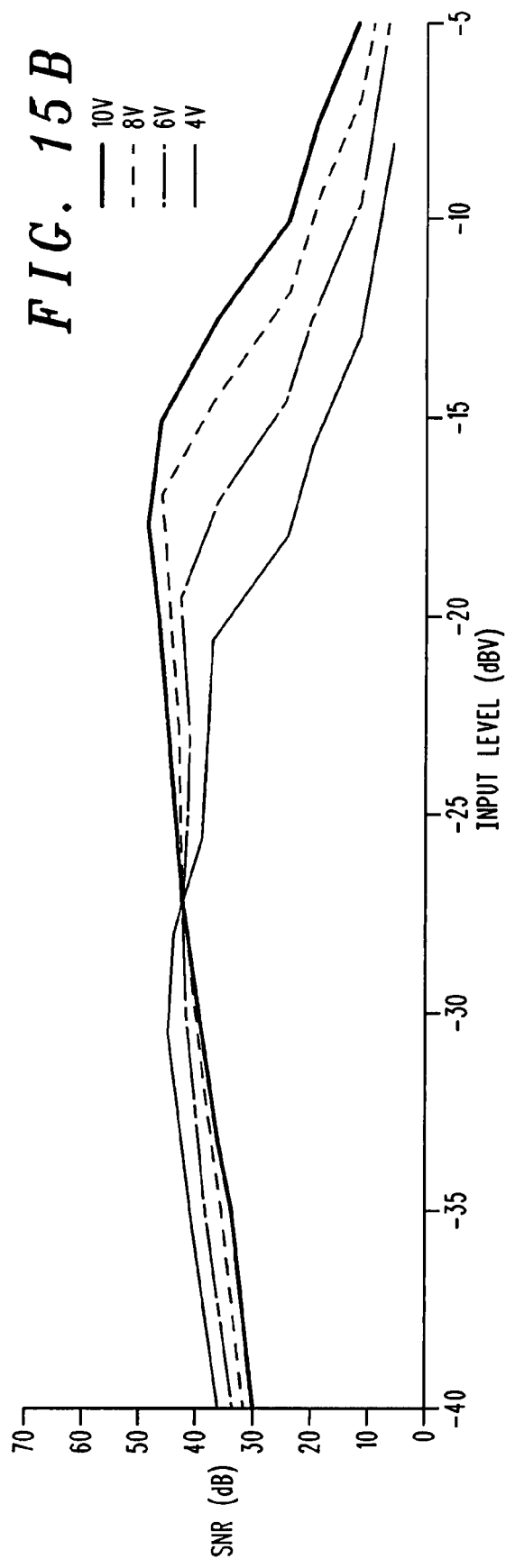

RADIO FREQUENCY POWER AMPLIFIER AND METHOD USING A CONTROLLED SUPPLY

RELATED APPLICATIONS

This application is a continuation in part of pending application titled RADIO FREQUENCY POWER AMPLIFIER AND METHOD USING AN AMPLITUDE CONTROL SYSTEM, Ser. No. 11/413,999 by Snelgrove et al. filed Apr. 28, 2006, which is a continuation in part of pending application titled RADIO FREQUENCY POWER AMPLIFIER AND CORRESPONDING METHOD, Ser. No. 11/089,834 by Snelgrove et al., filed on Mar. 25, 2005 now U.S. Pat. No. 7,352,237, both of which are hereby incorporated herein in their entirety by reference. This application is related to co-pending application titled RADIO FREQUENCY POWER AMPLIFIER AND METHOD USING A PLURALITY OF FEEDBACK SYSTEMS, Ser. No. 11/413,998 by Mekechuk et al., filed on Apr. 28, 2006 which is hereby incorporated herein in its entirety by reference. This application also claims priority from Provisional Application Ser. No. 60/814,341 by Snelgrove, filed on Jun. 16, 2006, which is also hereby incorporated herein in its entirety by reference.

FIELD OF THE INVENTION

This invention relates in general to communication equipment, and more specifically to radio frequency power amplifiers.

BACKGROUND OF THE INVENTION

Radio-frequency power amplifiers are essential components of transmitters found in radio communication systems, and are deployed in various applications, such as mobile telephony, broadcast, wireless data networking, radiolocation and other fields. Generally, they function to make copies of their inputs, which are signals generated by other components of communication equipment, such as base transmitters, mobile devices, or the like, where the copies or output signals are powerful enough to propagate for appropriate distances. Two often conflicting requirements that constrain radio frequency power amplifiers are linearity and efficiency.

The linearity requirement or constraint on a radio frequency power amplifier is that it reproduce the form of its input signal faithfully. Small distortions in the form of the output signal relative to the input can cause the radio frequency power amplifier output signal to interfere with other radio services, in violation of regulatory requirements, or make it difficult or impossible to receive/demodulate the signal accurately. These distortions may be caused, for example, by the fact that the characteristics of the components of which a radio frequency power amplifier is composed (e.g. transistors) are non-ideal, e.g., vary with the electrical currents that they carry, which necessarily include the signal being reproduced. A conventional method ("class A operation") of getting good linearity in this situation is to add a large "bias" current to signal currents so that current variations due to the signal are small in comparison.

The efficiency requirement or constraint means that the amplifier should not consume excessive power relative to its desired output power: thus, for example, an amplifier required to produce 10 Watts of output power may typically consume 100 Watts. This is often caused by the use of large bias currents, as described above, to improve linearity. The power (90 Watts in the example) "wasted" in this way causes many problems. For example, the power dissipated is manifested as heat, which has to be removed—often with large heat sinks and fans—before it causes temperature rises that damage the amplifier or other circuits. When equipment is battery-operated (e.g. in cell phones or in fixed installations (base transmitters) that are running on backup batteries during a power failure), battery size and hence weight and cost increases directly with power requirements.

Relatively efficient power amplifier circuits are known, and for radio frequency power amplifiers one of the more efficient is known as type or class "E". These amplifiers attempt to operate their transistors as pure switches, which in principle dissipate (and hence waste) no power. Their operation depends on synchronization between closing the "switch" device and the "ringing" of a resonant load circuit, such that the switch is only driven closed at times when the voltage across it is almost zero. However, class E amplifiers pose problems. For example, since their output power is effectively set by a power supply voltage, they are difficult to amplitude-modulate and attempts to do so have resulted in both poor efficiency and poor linearity. The inability to modulate amplitude severely limits the applicability of class E amplifiers in most modern systems employing complex forms of modulation with varying amplitude or amplitude inverting signals.

Another switching power amplifier is known as class "D". This amplifier architecture has been used for audio-frequency applications. Class D amplifiers in theory have low power dissipation (e.g. a switch does not dissipate power). In practice, Class D amplifiers are continually discharging capacitance (e.g., when turned on) and this can amount to significant power dissipation at radio frequencies.

Sigma delta technology is a known technique that allows feedback to be used to linearize, for example, class "D" switching amplifiers for audio-frequency use, but ordinarily this technology requires that switching events be synchronous to a fixed clock frequency. Typically, a sigma delta loop samples the output of a loop filter at a fixed rate that is independent of any input signal. This causes problems for many radio frequency power amplifiers since their inputs need to be synchronized with a high frequency signal. Note that sigma delta and delta sigma are expressions that may be used interchangeably in this document.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages in accordance with the present invention.

FIG. 5A-FIG. 5D illustrate representative waveforms that may be observed in, e.g., the FIG. 4 embodiment of a controlled supply;

FIG. 15A and FIG. 15B illustrate simulation results of a more practical radio frequency amplifier with different power supply levels;

DETAILED DESCRIPTION

Figure 1:
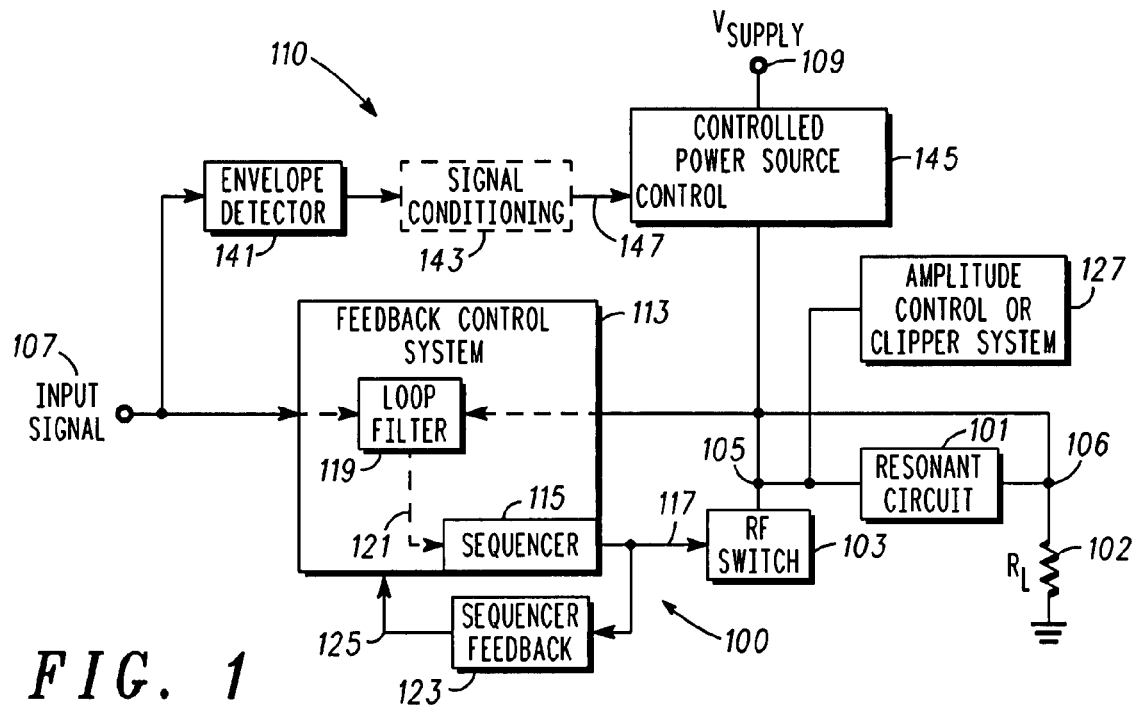
FIG. 1 depicts, in a simplified and representative form, a block diagram of a radio frequency power amplifier with a controlled supply according to various exemplary embodiments.

In overview, the present disclosure primarily concerns communication equipment including radio frequency transmitters or amplifiers such as used in infrastructure equipment including base stations or in communications units. Such radio frequency amplifiers for example, may be found in cellular, two-way, and the like radio networks or systems in the form of fixed or stationary and mobile equipment. The fixed equipment is often referred to as base stations or transmitters and the mobile equipment can be referred to as communication units, devices, handsets, or mobile stations. Such systems and equipment are normally used to support and provide services such as voice and data communication services to or for such communication units or users thereof.

More particularly, various inventive concepts and principles are embodied in systems or constituent elements, communication units, transmitters and methods therein for providing or facilitating radio frequency amplifiers or power amplifiers with significant improvements in efficiency, linearity or signal to noise, and costs. Note that costs include costs associated with size and operational issues. The improvements can be associated, for example, with power supplies and heat management issues as impacted by improved efficiency. The improvements may also be reflected in lower component or production costs since the concepts and principles allow less expensive components, such as smaller transistors, to be used for higher power levels. The radio frequency power amplifiers advantageously use a feedback control system and a controlled supply, which controls, e.g., the energy supplied to a radio frequency gain stage and can control other parameters as will be further discussed and described. Some embodiments can utilize one or more of a controlled power source (e.g., regulator coupled to a primary source), a version of a delta sigma modulator in the feed back control system as well as an amplitude limiting system and in some instances a second feedback system thereby advantageously yielding a practical and readily producible power amplifier provided such amplifiers are arranged and constructed in accordance with the concepts and principles discussed and disclosed herein.

The communication systems and communication transmitters that are of particular interest are those that may employ some form of complex modulation and that may provide or facilitate voice communication services or data or messaging including video services over local area networks (LANs) or wide area networks (WANs), such as conventional two way systems and devices, various cellular phone systems including but not limited to, CDMA (code division multiple access) and variants thereof, GSM, GPRS (General Packet Radio System), 2.5G and 3G systems such as UMTS (Universal Mobile Telecommunication Service) systems, 4G OFDM (Orthogonal Frequency Division Multiplexed) systems, WiMax (IEEE 802.16), ETSI HiperMAN and variants or evolutions thereof.

The inventive concepts and principles described and discussed herein may be advantageously applied in any field where variable radio frequency power is required or appropriate. For example, certain medical, heating, lighting, and sensing applications may find the concepts and principles useful.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in integrated circuits (ICs) such as custom ICs with some ICs using high speed and relatively high power technologies. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs, if any, will be limited to the essentials with respect to the principles and concepts of the exemplary embodiments.

Many of the Figures illustrate various embodiments of radio frequency power amplifiers that are arranged and constructed and operate in an inventive manner. The inventors refer to some of these embodiments of power amplifier as a class M power amplifier. These power amplifiers provide replication and amplification of an input signal that includes modulation, such as amplitude modulation, phase modulation or complex modulation (amplitude and phase modulation) in a linear and efficient manner. Generally these radio frequency power amplifiers utilize a novel arrangement of a radio frequency gain stage or radio frequency switching or quasi switching gain stage driving resonant circuits, a controlled supply system for providing power which is controlled in accordance with an input signal (power that is needed by the gain stage, etc. to replicate the input signal), and a feedback control loop that operates to induce or control timing associated with the gain stage so as to linearly replicate an input signal including complex modulation as applied to a resultant load or amplifier output signal and to encourage switching or operation of the gain stage at times when on average the voltage across the stage is at a minimum. An amplitude limiting system can also be employed. Heretofore it has not been possible to drive a radio frequency gain stage so as to reproduce modulation with both good linearity and large degrees of amplitude modulation or complex modulation while maintaining good amplifier efficiency.

These radio frequency power amplifiers can advantageously be implemented as one or more integrated circuits. For example, the switching stage and some elements of the amplitude limiting or clipper system, e.g., diodes, can be implemented in a high power density gallium arsenide, gallium nitride, silicon based power device, or the like process. The controlled supply and processing systems or circuitry will typically be required to function at bandwidths similar to the bandwidth of the input signal (10s of MHz), with a regulator handling power levels needed by the radio frequency amplifier. For the feedback systems and feedback control loop or system or one or more constituent elements, a known high frequency submicron silicon based process may be advantageous.

Referring to FIG. 1, a block diagram of a radio frequency power amplifier according to various exemplary embodiments will be discussed and described. FIG. 1 shows a radio frequency power amplifier 100 that is coupled to and arranged and configured to drive a resonant load including resonant circuit 101. The radio frequency power amplifier 100 will typically operate at frequencies from tens of Mega Hertz (MHz) to multiple Giga Hertz (GHz) and is generally utilized to amplify an input signal to provide a higher power output signal. The resonant load as will be further described herein below is comprised of a combination of inductive and capacitive elements (the resonant circuit) and a load (shown as RL 102). RL 102 may include, for example, a harmonic filter, isolators, circulators, antenna, cable, or the like, that is driven by the resultant output or load output signal.

The radio frequency power amplifier 100 comprises a radio frequency switching or gain stage 103 with an output 105 that is coupled to the resonant circuit 101 and configured to provide an output signal at output 105 with complex modulation, e.g., amplitude modulation (AM) and/or phase modulation (PM), corresponding to modulation of an input signal at input 107 when, for example, powered from a fixed voltage, $V_{SUPPLY}$ 109, via, a controlled supply 110, which is configured to provide power to the gain stage or other systems that is controlled in accordance with the input signal or other signals. The FIG. 1 embodiment of the radio frequency power amplifier 100 further comprises a feedback control system 113 that is coupled to the input (thus input signal 107) and the output 105 or load output signal at 106 (thus output signal or one or more variants thereof as a feedback signal). Additionally, a feedback system 123 and amplitude control or clipper system 127 can be included. Note that the input terminal or node and the input signal may alternatively be referred to as input 107 or input signal 107. Similarly the output 105 and output signal at 105 or load output signal at 106 may alternatively be referred to as output 105 or output 106 or output signal.

The feedback control system 113 is configured to provide a sequencer output at output 117 that is used to drive the radio frequency switching or gain stage 103. The sequencer output can be provided by, e.g., a sequencer 115 that is included with the feedback control system 113. Advantageously in one or more embodiments, the sequencer output has at least one state, e.g., an OFF state, with a starting time or which begins at a variable time that is determined by the feedback control system 113. Generally the sequencer output has an occurrence rate or an average frequency that is near an average frequency of the input signal. The feedback system 123 in the embodiment of FIG. 1 is coupled and responsive to the sequencer output at output 117 (alternatively referred to as sequencer output 117) and provides a second feedback signal at 125 that is coupled to the feedback control system 113 in varying embodiments as further described below. The sequencer output 117 will correspond to one or more of the output signal, the input signal, the second feedback signal, a combination of the output, input, and feedback signals, or the like as will be further discussed below.

The amplitude control system or clipper system 127 in the embodiment of FIG. 1 is coupled to the output of the radio frequency switching or gain stage or output signal 105 and configured to control or limit an amplitude of the output signal, e.g., to a constrained or maximum amplitude. Thus, the feedback signal corresponds to the output signal as limited, e.g., with the maximum or constrained amplitude. Furthermore, the output signal as limited is applied to the resonant circuit or resonant load. Advantageously with the amplitude control or limiting system 127 in this or other embodiments described below, the maximum value of the output signal can be significantly decreased (e.g., by a factor of 2-3 is some instances) which helps protect the radio frequency switching stage or allows use of technologies for the switching stage with lower breakdown voltages. Furthermore, when the maximum amplitude is limited or constrained with the control or clipping system 127, the required dynamic range of various circuits in the feedback control system 119, e.g., loop filter, can be designed with a lower dynamic range, which often results in using less substrate area in integrated circuit embodiments and therefore lower costs. The radio frequency switching stage 103 may be implemented in various forms, however it may be particularly advantageous when the switching stage together with the resonant circuit 101 is arranged as a radio frequency power amplifier similar to a class E configuration or a class F configuration.

The radio frequency power amplifier 100 of FIG. 1 and specifically the feedback control system 113 in one or more embodiments further comprises a loop filter 119. The loop filter 119 is responsive to the input signal and the output signal or first feedback signal via the inter coupling as shown and the loop filter is configured to provide a filtered signal at 121. The sequencer 115 is responsive directly or indirectly to the filtered signal at 121. For a given embodiment of a sequencer there will normally be a defined relationship between the operation of the sequencer and the output or filtered signal from the loop filter as well as the second feedback signal, e.g. rising edge zero crossings of the loop filter signal, specifically input to the sequencer, trigger the sequencer. The loop filter may be, e.g., an nth order (n=1, 2, 3, . . . ) band pass filter, or an nth order low pass filter depending on other particulars of the feedback control system.

For example, if the input signal is at or centered at a desired carrier frequency (e.g., 900 MHz, 2.4 GHz, etc) or some other frequency, such as an intermediate frequency, that is above 0 hertz, a band pass filter may be advantageous. Alternatively if the input signal is centered at 0 hertz or a relatively low frequency, e.g. a base band frequency, relative to the carrier frequency, a low pass filter can be more useful. In the latter case or where the input signal is not centered at the carrier frequency, a mixer arrangement can be employed to provide a first feedback signal, e.g., input signal to the filter, where the feedback signal corresponds to the output signal as down converted by the mixer arrangement and provide a sequencer input corresponding to the filtered signal, i.e., in some embodiments a combination of the input signal and the feedback signal, as up converted by the mixer arrangement.

It is further noted that the second feedback signal can be directly combined with the filtered signal, or used as an additional input to the loop filter or may be used to affect or modify or otherwise change the filtered signal and thus impact the sequencer input and therefore sequencer output. These alternatives will be described below in additional detail or are described in co-pending application bearing Ser. No. 11/413,998 with reference to, e.g., FIGS. 2-5 and 7. Without loss of generality portions of the following discussion will refer to an embodiment where the second feedback signal is combined with the filtered signal from the loop filter with the resultant signal used as the sequencer input. In these instances the second feedback signal is coupled to the input to the sequencer. It should be understood that one or more alternative embodiments use the second feedback signal 125 to otherwise affect or modify the filtered signal from the loop filter 119, i.e., the second feedback signal can be one component of the input signal for the filter or can be coupled directly to some portion of the filter and thus affect the filtered signal.

The controlled supply 110 as will be further discussed and described herein below can take various forms and operate in various manners. By virtue of being used in the radio frequency power amplifiers including feedback control in accordance with one or more embodiments as described or claimed, the controlled supply need not be particularly precise (accurate or linear). In some conventional techniques, a complex signal is separated into AM (amplitude modulation) and PM (phase or frequency modulation) components and a modulated voltage source reproduces a supply voltage with the AM, the amplifier gain stages reproduce the PM and the supply voltage with the AM is used to power the last gain stage and thereby provide the AM on the radio frequency output signal. These schemes have not been successful in radio frequency power amplifiers in large part because of the linearity and phase requirements that are placed on the modulated voltage supply as well as gain stages.

With the radio frequency power amplifier including the feedback control system, the amplifier is still responsive to AM and PM and the error signal in the feedback control system is being minimized. The controlled supply can be used to improve one or more of efficiency, dynamic range, as well signal to noise or interference ratios. In a sense the controlled supply eases the burden on the radio frequency power amplifier with the feedback control system. Additionally or alternatively, since the power amplifier with the feedback control system can correct for AM or PM errors, the requirements on the linearity of controlled supply from an AM transfer perspective (input to envelope of the radio frequency output signal at 106) is decreased significantly.

The controlled supply 110 of FIG. 1 includes an energy or power source which is controlled, i.e., a controlled power source 145. This controlled supply can be a controlled current source, controlled voltage source, or some combination. Generally the controlled power source 145 can be a linear or switching type of controlled power source, i.e., a linear regulator or switching regulator. Generally a switching type of source may be preferred over a linear source or regulator due to improved efficiency. Topologies such as a buck, boost, or buck-boost topology are known and may be used. Depending on the embodiment additional circuitry may be appropriate, e.g., an inductor/choke can be inserted between a controlled voltage source and output 105. In the embodiment of FIG. 1, the controlled supply 110 includes an envelope detector 141 coupled to the input signal 107 and configured to provide an output signal corresponding to an envelope of the input signal. The envelope detector 141 is generally known and can provide the square root of the sum of the squares of the real and imaginary portion of the input signal or may use an average peak detector arrangement (diode coupled to a parallel capacitor and resistor). This output signal from the detector 141, in some embodiments, is coupled to a signal conditioner 143 with the output of the signal conditioner at 147 further coupled to the controlled power source 145. The controlled power source is thus responsive to the envelope of the input signal in various embodiments.

The signal conditioner 143 can perform various signal processing functions including linear or non-linear processing and may be implemented in hardware or via digital signal processing including appropriate software instructions or various combinations thereof. The signal conditioner 143 can perform functions such as filtering, amplification, introduction of a delay, addition of an offset and non-linear functions such as peak or trough clipping, predistortion of varying forms, forming a square of the envelope or taking a square root or the like.

Figure 2A:
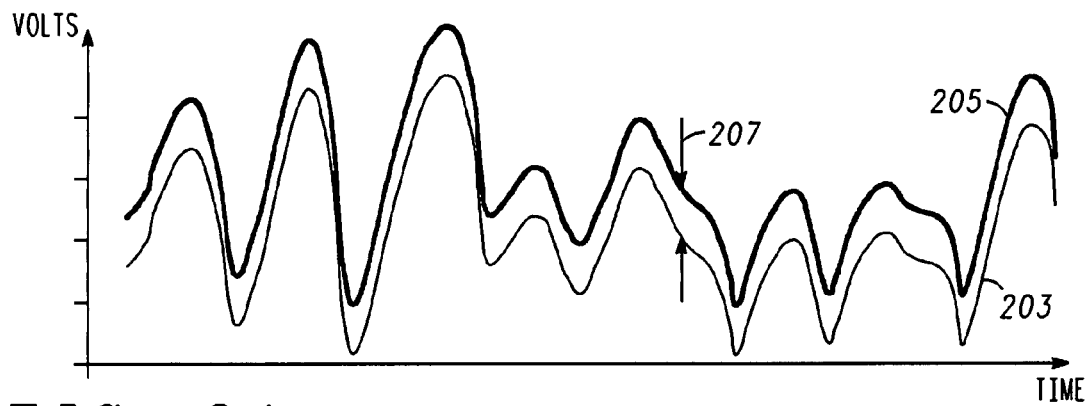
FIG. 2A-FIG. 2C illustrates representative waveforms, etc. that may be observed in, e.g., the FIG. 1 radio frequency power amplifier.
Figure 2B:
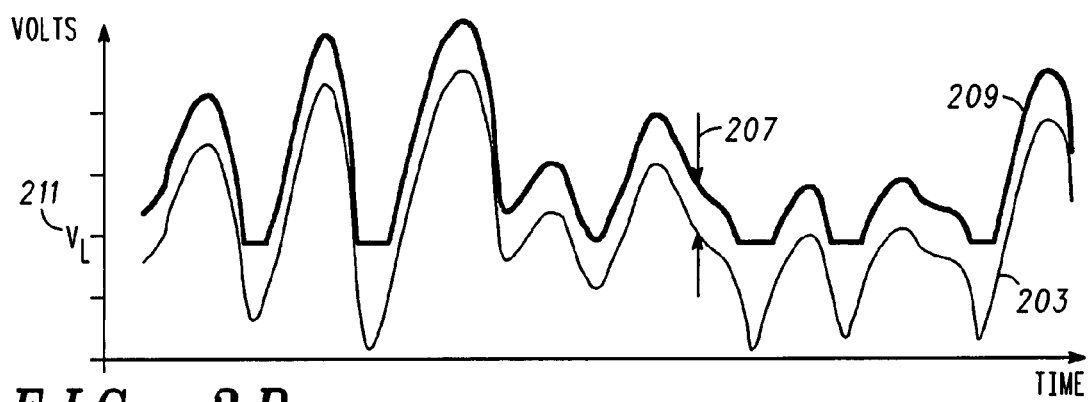

Referring to FIG. 2A-FIG. 2B representative waveforms that may be observed in varying embodiments of the FIG. 1 radio frequency amplifier and specifically the controlled supply 110 will be discussed and described. All three figures show the output of a controlled power source operating as a voltage source and an ideal envelope signal or voltage with signal level on the vertical axis and time on the horizontal axis. The control signal of the controlled power source in these three cases is assumed to be the envelope of the radio frequency power amplifier (RF PA) input signal 107, along with any signal conditioning that may be implemented. The ideal envelope voltage is that voltage or supply voltage which optimizes one or more performance metrics (figures of merit) of the RF PA, such as, instantaneous power added efficiency or linearity. These performance metrics will typically degrade asymmetrically when the actual envelope voltage is too high or too low; for example, linearity may suffer significantly when the actual envelope is too low, whereas, power added efficiency will normally degrade slowly as the actual envelope increases beyond the ideal envelope.

FIG. 2A illustrates an ideal envelope signal 203 in comparison to the output voltage 205 from an embodiment of a controlled power source whose output voltage is nearly proportional to its input control signal (e.g., envelope of the input signal 107) plus a fixed offset 207. The fixed offset can be added via the signal conditioner or within the controlled power source. The fixed offset 207 can be added to the controlled power source output voltage to allow for any difference between the ideal envelope and the output voltage of the controlled power source that may be present, intentionally or unintentionally. Due to the presence of the feedback control system 113 and the fixed offset 207, the output voltage 205 of the controlled power source need not precisely track the ideal envelope voltage 203. This is advantageous because it enables the controlled power source to be implemented with significantly lower precision than that which would be required in, e.g., known envelope elimination and restoration type systems. The requirement for a less precise controlled power source will typically translate into a simpler and less expensive circuit.

FIG. 2B illustrates the ideal envelope signal 203 in comparison to an output voltage 209 from an embodiment of a controlled power source whose output voltage is nearly proportional to its input control signal plus the fixed offset 207, however, additional control circuitry limits the lower excursion of the controlled power source output voltage to a minimum of $V_L$ volts 211. This scheme illustrates the implementation of a non-linear relationship between the controlled power source output voltage and its input control voltage (e.g., input signal 107 envelope). The clipping function can be provided by a signal conditioner or within the controlled power source, using, e.g., a threshold function. This type of relationship between the controlled power source output voltage and its input control voltage may be desirable, for instance, when the dynamic range of the output voltage is limited by the particular circuit implementation of the controlled power source or the like.

Figure 2C:
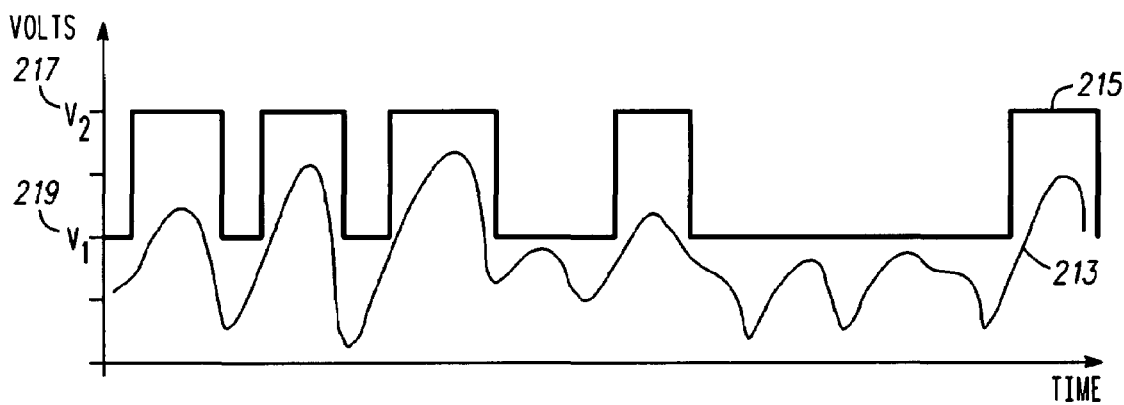

FIG. 2C illustrates an ideal envelope signal 213 in comparison to an output voltage from an embodiment of a controlled power source where the output voltage is restricted to two discrete levels, $V_1$ 219 or $V_2$ 217. The controlled power source output voltage is controlled such that its "normal" operating level is $V_1$, and will only switch to level $V_2$ when the input control signal exceeds a threshold level, e.g., a threshold voltage that is equivalent to an ideal envelope voltage that is somewhat below $V_1$. This type of control scheme is advantageous as it can be implemented using a common type of switched power converter, for instance, a buck-boost converter. Two discrete voltage levels can result in an increase in the RF PA's efficiency, especially when the envelope of the PA's output signal has a high peak to average power ratio.

Figure 3:
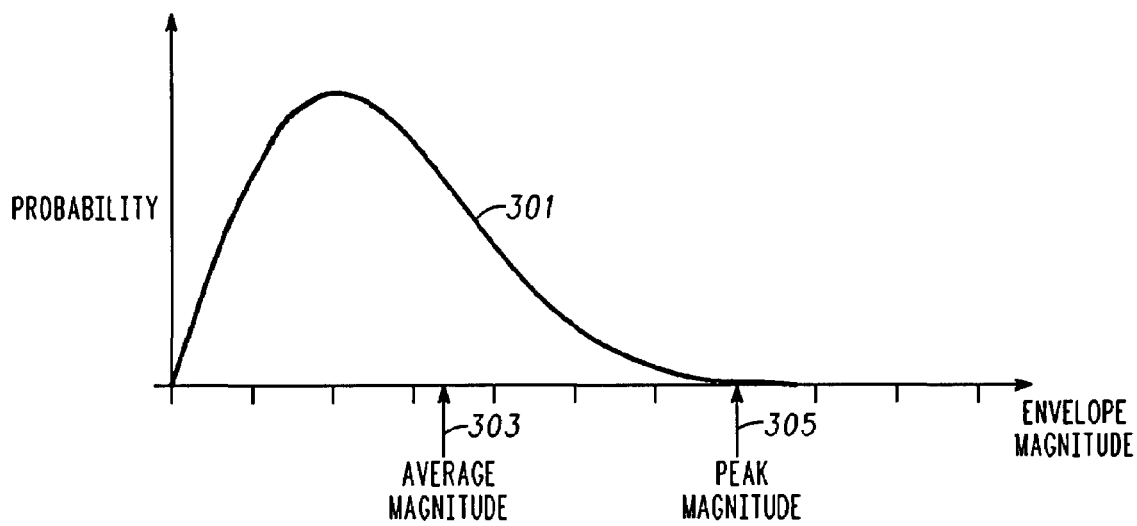
FIG. 3 illustrates a representative probability distribution for a signal envelope of a typical radio frequency carrier.

FIG. 3 shows a truncated Rayleigh probability distribution function 301 that is typical of complex digital communication carriers, for instance, an IS-95, cdma2000 or WCDMA carrier. Such carriers will commonly have a peak to average power ratio in excess of 6.5 dB (equivalent to a peak to average envelope magnitude of approximately 2.1). Assuming a peak to average power ratio of 6.5 dB, and a peak envelope magnitude 305 of, e.g., 7 units, the equivalent average magnitude 303 is shown in FIG. 3. Because the median of the distribution is below its average, it is evident that if $V_1$ in FIG. 2C is equal to the average, the envelope will spend more than half of the time below $V_1$. Hence, despite using only two discrete levels as shown in FIG. 2C, significant improvements in RF PA efficiency can be achieved. Although only two discrete levels are shown in FIG. 2C, it may be advantageous to employ a multitude of discrete levels, e.g., 3 or more. From this discussion the specifics will depend on probability distributions for the envelope and may be a trade off between complexity of the controlled supply and efficiency performance.

In all three of the control schemes illustrated in FIGS. 2A, 2B and 2C, the output voltage of the Controlled Power Source is restricted to be higher than the ideal envelope voltage. Although it is possible to allow for the Controlled Power Source output voltage to fall below the ideal envelope voltage for short periods of time, doing so will ordinarily result in degraded linearity performance of the RF PA.

Figure 4:
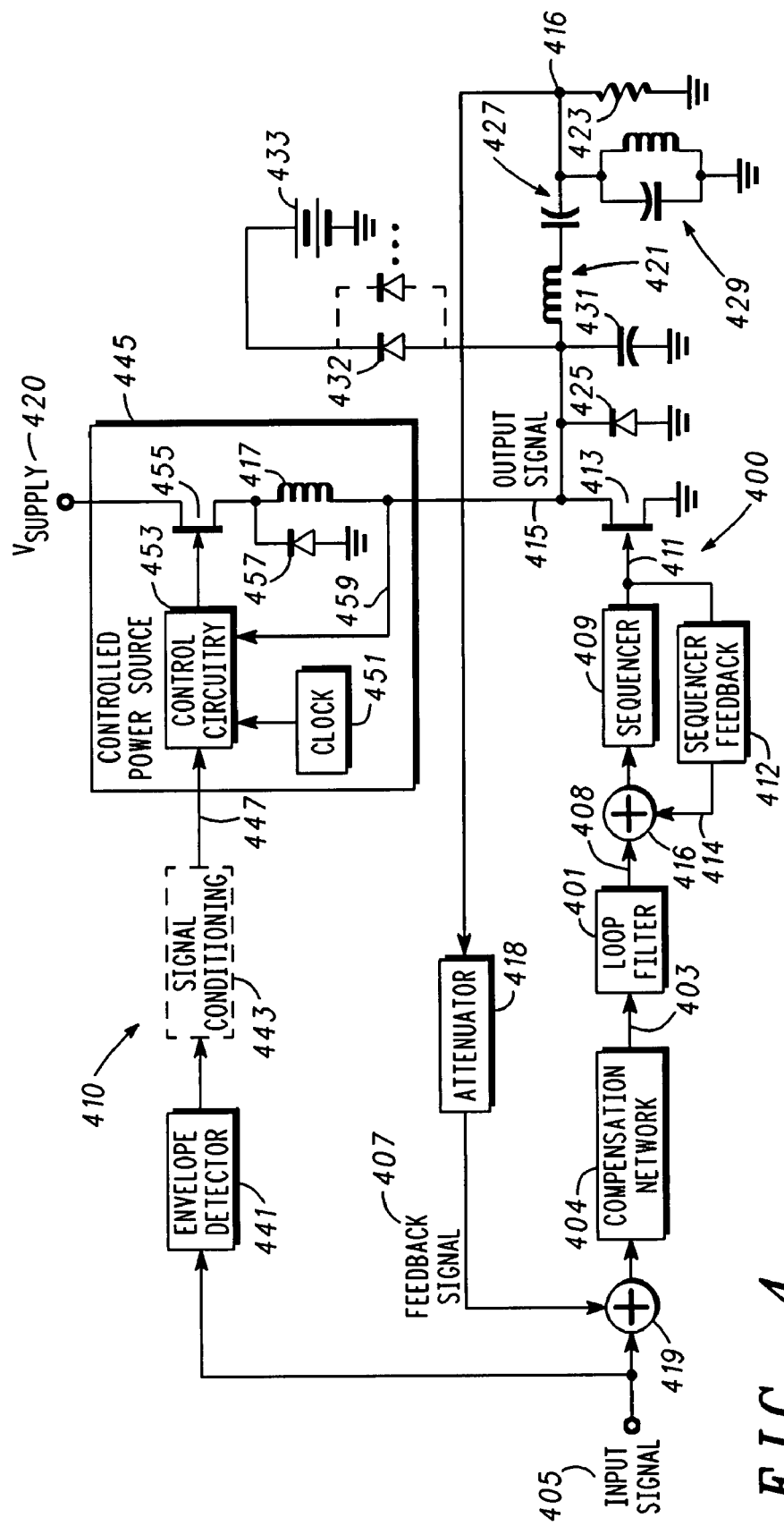
FIG. 4 depicts, in a simplified and representative form, a more detailed block diagram of a further radio frequency power amplifier according to one or more exemplary embodiments.

Referring to FIG. 4, a more detailed block diagram of a radio frequency power amplifier according to one or more exemplary embodiments will be discussed and described. In FIG. 4, a radio frequency power amplifier 400 comprises as part of a feedback control system, a loop filter 401 with an input 403 coupled to a signal corresponding to an input signal 405 and a first feedback signal 407 (an error signal), specifically an output from compensation network 404. Compensation network 404 is provided to compensate its input signal for magnitude or phase as will be further discussed below. Note that the feedback signal 407 and the terminal or node where the feedback signal is found will alternatively be referred to by reference numeral 407. In this embodiment where the input signal has (or is centered about a frequency equal to) the desired output carrier frequency, the loop filter 401 will normally be a relatively high gain nth order band pass filter, with n=1, 2, 3, . . . Further included is a combiner 416 (analog adder) that is coupled to an output terminal 408 and responsive to a filter output or filtered output signal from the loop filter 401 (filtered error signal) and a second feedback signal at 414 provided by a second feedback system 412, e.g., sequencer feedback. Further included and depicted is a sequencer 409 that is configured to provide a sequencer output at output 411. The sequencer output has at least one state, e.g., an OFF state, with a starting time that corresponds to the output signal from the combiner 416, i.e., filter output and second feedback signal as will be further discussed below.

Additionally included is a radio frequency gain or switching stage 413 that is driven by the sequencer output and configured to provide an output signal at 415. As shown in one or more embodiments the gain or switching stage is supplied DC (direct current) power from a constant voltage source $V_{SUPPLY}$ 420 via a controlled supply 410 and in the illustrated embodiment a feed choke or inductor 417. The output signal is coupled to an amplitude limiter or clipper circuit that is configured similarly to FIG. 1 to limit or constrain an amplitude of the output signal. The clipper circuit or system in one or more embodiments can comprise a diode array 432 comprising one or more diodes with the anode(s) coupled to the output signal and the cathode(s) coupled to a voltage source 433, e.g., battery or other DC supply that can sink current where the voltage source has or maintains a reference voltage or clip voltage that with this arrangement corresponds to a maximum amplitude of the output signal. Ideally the maximum amplitude would equal the reference voltage of the voltage source, however the currents involved and impedance as well as various parasitics of the diode(s) etc. and characteristic voltage drops will result in some difference between the reference voltage and the maximum amplitude of the output signal. Note that the voltage source 433, e.g., battery, may be used for or as a power recovery system as will be further discussed below with reference to, e.g., FIG. 8.

The output signal at 415 or, as illustrated, a filtered version thereof 416 (signal across a load 423) is coupled via an attenuator 418 back to be combined with the input signal at summer 419. Thus, the feedback signal 407 corresponds to the output signal 415 as limited or clipped and in this illustrated embodiment as further filtered 416. The summer 419 provides the signal to the compensation network 404 which compensates for the additional filtering between 415 and 416 and provides the signal at 403 to the loop filter 401. Thus the signal coupled to the input of the loop filter can be an error signal corresponding to an algebraic combination of the input signal and the feedback signal. The radio frequency switching or gain stage in one or more embodiments is a field effect transistor (FET or JFET) but may also be a bipolar transistor or the like. In some embodiments the FET or JFET is formed using known GaAs (gallium arsenide), GaN (gallium nitride), LDMOS (Laterally Diffused Metal Oxide Semiconductor) process technology as noted earlier. It can be advantageous for various reasons (parasitics, similar breakdown voltage requirements, etc.) to form the diode array 432 in the same technologies as the switching stage(s). Note that while the switching stage is shown as one transistor a plurality of transistors may be used essentially in parallel to perform the switching function. Note also that appropriate circuitry, such as additional gain stages will be needed, either as part of the sequencer or switching/gain stage in order to insure that the switching/gain stage is properly driven.

Those of ordinary skill will recognize that if the sequencer 409 provides a quantized output, i.e. a finite number of fixed levels or states, the amplifier of FIG. 4 (and others) has an architecture similar to a delta sigma (alternatively sigma delta) converter. However, the operation and function of the sequencer is distinctly different for a number reasons including for example asynchronous operation or quasi asynchronous operation (i.e., not synchronized to a fixed clock) where the states of the sequencer correspond to states of the output signal or first feedback signal, input signal, and second feedback signal or output from the loop filter and second feedback signal.

The output signal at 415 is applied to a resonant circuit 421 and via the resonant circuit 421 to a load 423. Placed across the switching stage 413 is a diode (catch or snub diode) 425 that is configured and operates to clamp the output signal to a voltage that is non-negative, i.e., essentially at ground potential. Note that diode 425 may be a parasitic diode, e.g., source to substrate diode or the like for the switch 413, or the switch itself may turn on or be turned on when the voltage at 415 is at or below ground. The resonant circuit 421 includes a series resonant inductor capacitor pair 427 that couples the output signal as filtered by the series resonant pair 427 to the load 423. Across or in parallel with the load is a parallel resonant inductor capacitor pair 429. Further included in the resonant circuit 421 is a capacitor 431 that is coupled in parallel with the switching stage 413. Those of ordinary skill will appreciate that the capacitor 431 will include at least a parasitic capacitance of switching stage 413 and depending on the particular embodiment the capacitor 431 may only include this and other parasitic capacitance.

Those of ordinary skill in the field will recognize the switching stage 413 (and others in other figures) together with the resonant circuit as shown and described can be arranged in or similar to a class F configuration. Alternative embodiments of the switching stage and the resonant circuit can be arranged in a known class E configuration (for example, eliminate the parallel inductor capacitor pair 429). Other architectures for class F or class E exist and may also be utilized. Class E and F power amplifiers while taking advantage of the open or short circuit zero power dissipation characteristics also recognize that in practice the switching stage takes a finite time period to change between these states and if both voltage and current are non-zero during the time period between states, power will be dissipated. Such power amplifier architectures attempt to avoid dissipating energy stored in the parasitic capacitance (at least part of capacitor 431) of the switching device or stage by insuring this energy is provided to or comes from the resonant circuit, e.g., resonant circuit 421, rather than being dissipated in the switching device 413. Thus these configurations strive to perform switching between states (ON/OFF) during those times when the voltage of the output signal, i.e., signal across the switching device, is ideally zero volts and furthermore if possible when the derivative of this voltage is also zero, i.e. switching currents will also be zero.

In practice with class E or class F and others these conditions can only be approached and then only when the output signal is at or nearly at a predetermined amplitude or power level for a given power supply level. In contrast, the radio frequency amplifier disclosed herein and in related applications, i.e., class M power amplifier, allows the amplitude or power level of the output signal over a frequency band of interest (in-band) to vary, e.g., in accordance with AM modulation requirements as reflected by modulation on an input signal, and encourages or controls the switching stage to switch between states at appropriate times which approach the ideal situation, i.e., with a voltage across the switching device that is relatively low and approaching or at zero as often as possible. For example, where, as here, the radio frequency switching stage is configured to drive a resonant load and controlled by the feedback control system, the switching stage can be configured to switch ON responsive to the sequencer output so that over a multitude of switch ON events an average voltage, e.g., root mean square of the voltages, imposed on the resonant load and across the switching stage at the switch ON event is less than ½, typically less than ¼ and often less than ¹⁄₁₀ of a maximum voltage imposed on the resonant load, e.g., in practice a voltage approaching the specified breakdown voltage associated with the radio frequency switching stage.

Furthermore, when amplitude modulation must be reproduced or included in the output signal, known class E and class F configurations are typically inefficient and exhibit poor linearity, i.e., known architectures simply do not work as a linear radio frequency power amplifier. In stark contrast, the radio frequency power amplifiers, i.e. class M radio frequency power amplifiers, as disclosed herein and in related applications are arranged such that the radio frequency switching stage as driven by the sequencer output is configured to provide an output signal including complex modulation (AM or PM) as imposed on the input signal even while, for example, powered from a constant voltage power supply with reasonable efficiency and linearity performance. Thus the present radio frequency switching stage as driven by the sequencer output is configured to provide an output signal that includes an amplified replica of the input signal over an input signal bandwidth or relevant input signal bandwidth, where the input signal includes at least one of amplitude modulation and phase modulation.

Additionally the radio frequency power amplifier of FIG. 4 includes a controlled supply 410, which operates similarly to one or more embodiments of the controlled supply 110 of FIG. 1. The controlled supply 410 includes intercoupled as depicted an envelope detector 441 coupled to the input signal 405 and may include a signal conditioner 443 that collectively provide an input signal or control signal at 447. As depicted in FIG. 4 the controlled supply further comprises a controlled power source 445 that includes a controller or control circuitry 453 that drives a FET switching device 455. The controlled power source 445 is a switched power converter that employs, inter coupled as shown, control circuitry 453, FET switching device 455, shunt diode 457, inductor 417, clock source 451 whose output is an input to the control circuitry 453, and a feedback signal 459 that is proportional to the output signal or power, e.g., output current, of the controlled power source 445. The controlled power source 445 provides an output current which is controlled in response to the input control signal 447.

With reference to FIGS. 5A-5D, various operational characteristics of the controlled power source will be discussed. The control circuitry 453 compares the feedback signal 459 (see FIG. 5B, 559) to the input control signal 447 (see FIG. 5B, 547) when a rising edge zero crossing appears on the clock signal from the clock source 451 (see FIG. 5D for the clock signal 501, which is switching in this embodiment at a 500 MHz rate). If the feedback signal 459 exceeds the input control signal 447 at the comparison time, the control circuitry outputs a low voltage until the next comparison instant (one clock cycle later) (see FIG. 5C). The low output voltage results in FET device 455 being turned "off" so that it stops conducting current, as evident by comparing FIGS. 5A and 5C, such that the choke 217 discharges and the feedback signal decreases, as shown in FIG. 5B. If the feedback signal 459 (curve 559) is less than the input control signal 447 (curve 549) at the comparison time, the control circuitry outputs a high voltage until the next comparison instant. The high output voltage results in FET device 455 being turned "on" so that it conducts current, as evident by comparing FIGS. 5A and 5C, such that the choke 417 charges, as shown in FIG. 5B. Note that the controlled power source 445 of FIG. 4 need not necessarily be implemented using a switch mode type of voltage, current or power regulator, instead, the controlled power source 445 may be implemented as a linear regulator (open or closed loop). Furthermore, the controlled power source 445 need not necessarily be implemented using a clocked (synchronous) switch mode type of voltage, current or power regulator, instead, the controlled power source 445 may be implemented as an asynchronous switching regulator (open or closed loop).

Figure 6:
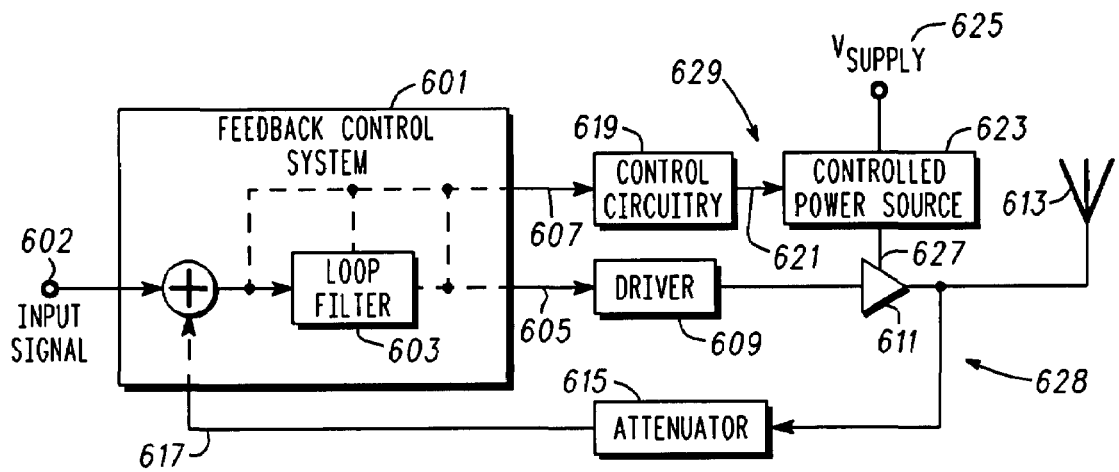
FIG. 6 illustrates, in a simplified and representative form, a block diagram of a radio frequency power amplifier using a plurality of control loops according to one or more exemplary embodiments.

Referring to FIG. 6 a simplified and representative block diagram of a radio frequency power amplifier using a plurality of control loops, which may be linear control loops (e.g., no sequencer), according to one or more exemplary embodiments will be discussed and described. FIG. 6 shows a controlled power supply and corresponding methodology where the power supply is driven from one or more loop filter error signals rather than, e.g., from an open-loop envelope estimate derived directly from the input signal. The novel closed-loop approach of FIG. 6 allows for more precise tracking of power supply levels in the presence of component variability, etc. than is possible with any open-loop system. For example, in the practical case in which amplifier gain is variable from unit to unit and over time and temperature, an open-loop envelope-based system must be designed conservatively so that supply voltage will be adequate for linear operation in the worst case; the net result being wasted power in the typical case. Closed-loop control of power level or supply voltage requires: a) detection of some indicator of power supply level relative to that required for proper operation, i.e., difference between power and desired power or difference between actual/present power or power level and desired/appropriate power or power level; b) filtering of this indicator to remove noise; and c) management of loop dynamics according to the art of control system design.

FIG. 6 shows an RF PA having two control loops. One loop, the "Lower Loop" encompasses the Input Signal 602, Feedback Control System 601, an RFGS (Driver 609, PA 611), and Attenuator 615. The lower loop can be thought of or referred to as an amplifier radio frequency loop 628 as this loop or a portion thereof is operating at or responding at radio frequencies with a bandwidth similar to the input signal (i.e., a relatively narrow band loop). Another loop, the "Upper Loop" encompasses $V_{SUPPLY}$ 625, Controlled Power Source 623, PA 611, Attenuator 615, the Input Signal 602, one or more feedback signals 607, and Control Circuitry 619. The upper loop can be thought of or referred to as a controlled supply loop 629, since this loop or a portion thereof is generally operating to vary or control a power supply or level of power or other parameters at or responding to baseband frequencies corresponding to the envelope of the input signal, i.e., near DC with a bandwidth similar to the input signal (i.e., a relatively broad band loop). Typically, the Lower Loop will be expected to perform with a high degree of linearity such that the propagation time around the loop is constrained to be much less that the reciprocal of the input signal bandwidth.

In addition, the Lower Loop is simultaneously responsive to AM and PM that may be present on the Input Signal. Furthermore, the PA that forms a part of both the Lower and Upper Loops, may be any type of amplifier, linear or non-linear—for instance, Class A, Class AB, Class B, Class C, Class D, Class E, Class F, Class G, etc. The only requirement is that the amplitude of the PA output be responsive to the magnitude of the power supply signal 627, whether in a linear or non-linear manner. As a general guideline, the total loop delay associated with the Upper Loop should be less than, e.g., the reciprocal of four times the bandwidth of the input signal envelope.

Control Circuitry 619 is responsive to one or more of: the input signal to Loop Filter 603, one or more internal states of Loop Filter 603, and the output 605 of the Loop Filter 603, which together forms the error signal 607 that is input to the Control Circuitry 619. The Control Circuitry generates a control signal 621, that causes the Controlled Power Source 623 to produce an output signal or power supply signal 627 such that the error signal 607 is driven towards a desired level, typically, a minimum level, i.e. zero. The Control Circuitry 619 may be comprised of analog and/or digital signal processing components and may include memory.

The Controlled Power Source of FIG. 6 can be similar to that described above in conjunction with FIG. 1 and others. Similar to the system of FIG. 1, the output signal of the Controlled Power Source need not be linearly related to the desired envelope sought to be impressed upon the PA output signal. In fact, as noted above, the Upper Loop can be relatively imprecise and may even be two or more discrete levels. A more detailed and particular embodiment of the amplifier of FIG. 6 will be discussed with reference to FIG. 19 below.

Figure 7:
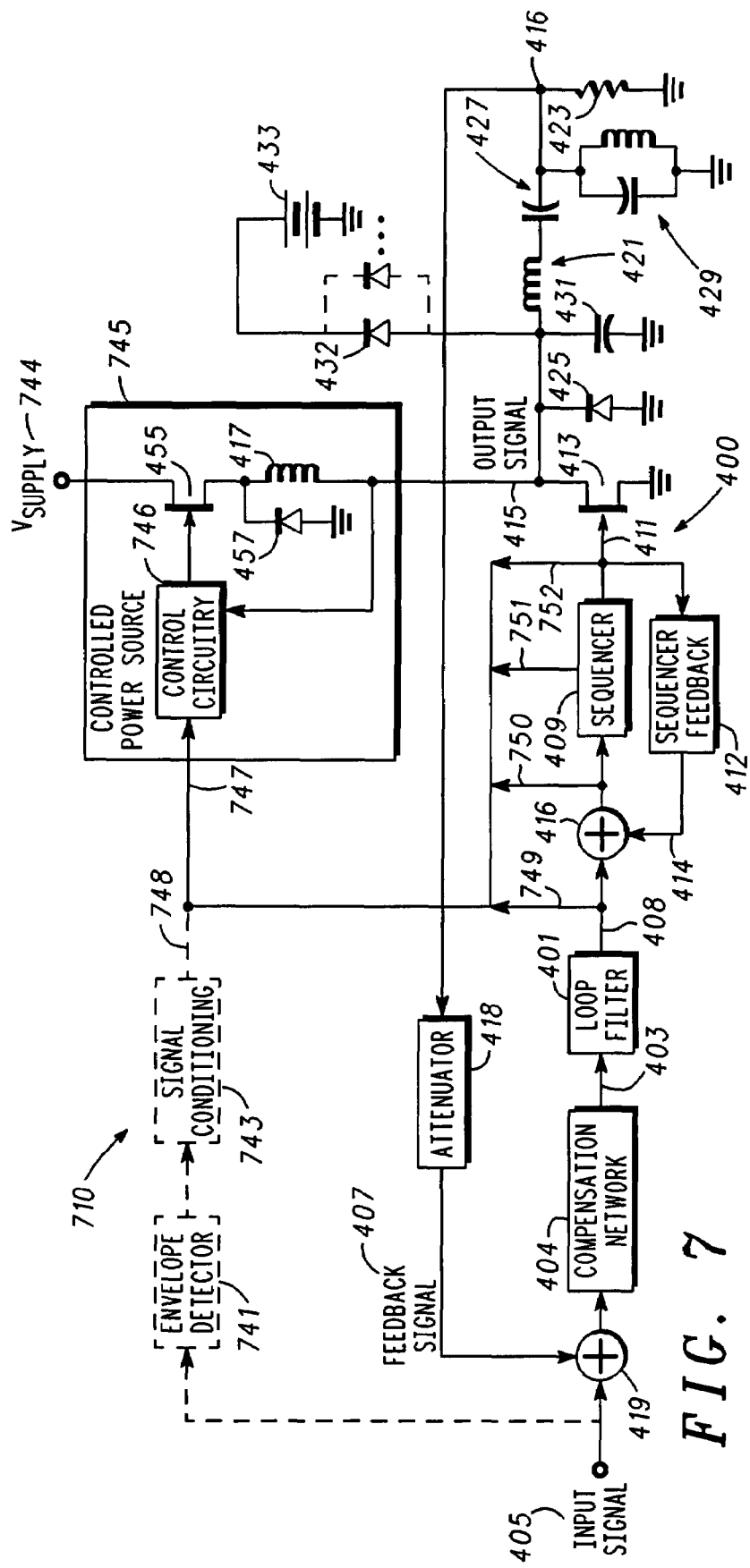
FIG. 7 depicts, in a simplified and representative form, a more detailed block diagram of a radio frequency power amplifier similar to that of FIG. 4 but including one or more additional inputs to a controlled supply according to one or more exemplary embodiments.

Referring to FIG. 7, a simplified and representative form of a block diagram of a radio frequency power amplifier similar to that of FIG. 4 but including one or more additional inputs to a controlled supply according to one or more exemplary embodiments will be discussed and described. Note that some of the operational characteristics and functions of various elements of the radio frequency power amplifier of FIG. 7 are similar to that of FIG. 4 and thus discussions of some elements will not be repeated. A controlled supply 710 is shown and comprises an envelope detector 741 similar to detector 441, signal conditioner 743 similar to conditioner 443 and a controlled power source 745 coupled to a fixed supply, $V_{SUPPLY}$ 744. The controlled power source 745 in FIG. 7 can be responsive to both an envelope signal from envelope detector 741 (as may be conditioned by conditioner 743) 748 and to the primary power amplifier error signal(s), e.g., output of loop filter 401 at 749, or one or more of 750, 751, or 752, collectively shown as control signal(s) 747. A key advantage of using signals emanating from the main amplifier control loop, is that such a system can provide closed-loop control of the controlled power source 745, which in turn allows the power source to be accurately controlled in the presence of variability of practical components.

These signals give different information about the desired output of power source 745, which can be advantageously combined. The signal at 749 (and 750-752) is "closed loop" in the sense of being responsive to the actual error signal (difference between input signal and feedback signal) at any given time, rather than to some apriori estimate, and may therefore be used to operate with a minimum offset voltage (the offset voltage being described with reference to FIGS. 2A, 2B and 2C and accompanying description). The filtered error signal at 749, etc. does not always depend monotonically on errors in the offset voltage, in fact, it typically responds to the absolute value of the error in the offset voltage, making it difficult to determine whether the offset voltage is too high or too low. The envelope signal has contrasting strengths and weaknesses: a strength is that it has no sign ambiguity, while a weakness is that it doesn't measure actual offset errors but only apriori estimates.

One method of combining this information is to use the envelope signal 748 as a first estimate of the desired output of controlled power source 745, and to allow the presence of large error voltages at 749 to increase the "setpoint" by (for example) a fixed amount, which could then be allowed to decay with time. This allows the setpoint for nominal offset voltage to be quite low, in the knowledge that if it is too low then information from 749 will correct it; but because the effect of 749 is constrained or limited, there is no danger of positive feedback causing runaway (as when an increase in offset voltage leads to a temporary increase in error voltage at 749).

In a second embodiment, information available from the signals at 749, 750, 751, or 752 can provide the primary control to Control Circuitry of the Controlled Power Source, while envelope information is used, e.g., to allow prediction of loop requirements. This can be done, in some systems, by adding a delay between input signal 405 and loop input 419 (or at compensation network 404), but not between input signal 405 and envelope detector 741. Knowledge of impending increases or decreases in the input envelope can be used to bias control decisions towards future needs.

Figure 17:
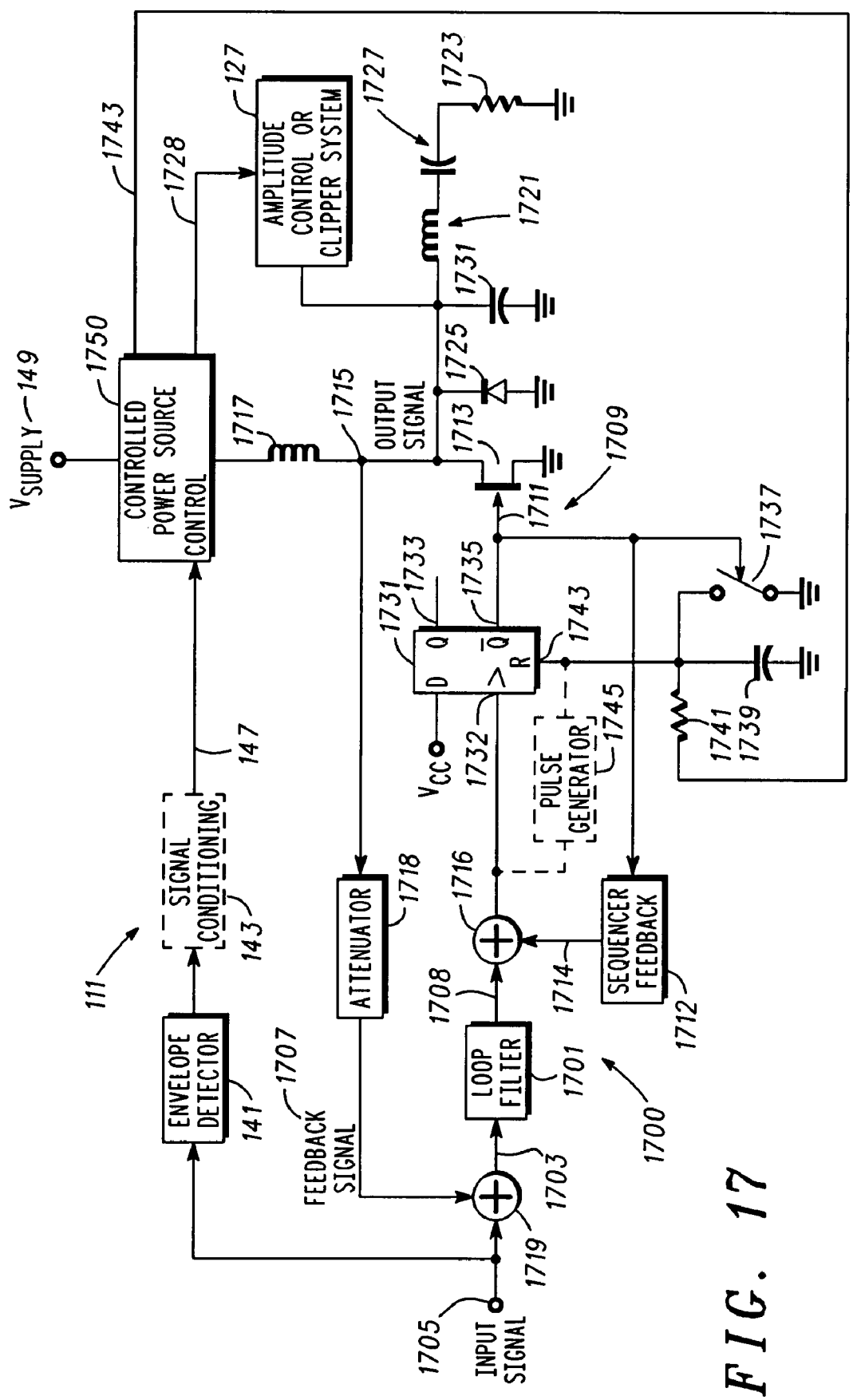
FIG. 17 shows a simplified and representative block diagram of a radio frequency power amplifier with a controlled supply and one embodiment of a sequencer in accordance with one or more embodiments.

When sequencer 409 is embodied as a mono-stable circuit responsive to zero crossings of its input signal, as shown in FIG. 17 and described above with reference to FIG. 4 or below with reference to FIG. 17, an indication that the power supply level is too low relative to the signal level currently demanded is that a long sequence of output pulses of the sequencer repeat approximately at the carrier frequency. In contrast, when the supply voltage is too high there will be frequent large changes in instantaneous frequency (or equivalently in cycle-to-cycle timing or phase relative to a reference at the carrier). Thus in this embodiment a frequency counter or phase detection circuit may be used to facilitate closed-loop control.

As a specific example, in a circuit intended for 1 GHz operation (1000 picosecond period) and with a sequencer producing pulses having a constant 500 picosecond OFF time, an indication that power supply voltage is too low could be that five consecutive ON pulses had periods between 450 picoseconds and 550 picoseconds. In this case the output level of controlled power source 745 could be increased by, for example, 200 mV and the counter reset from five to zero. To provide a complementary mechanism to reduce the level of controlled power source 745, it could be decreased, by e.g. 100 mV, each time that an ON pulse was outside the range of 400 to 600 picoseconds. Both of these rules would be subject to "clipping" such that the voltage output of controlled power source 745 never exceeds a maximum level, for example 28V and is never less than a minimum level, for example 12V. The maximum and minimum limits may be required to avoid damage to the output device from a voltage that is too high or overdriving the power transistor or gain stage 413 if the voltage is too low.

The circuitry required to detect lengths of ON pulses and to count their occurrence rate could be implemented as part of sequencer 409, so that an "up/down" signal would be passed on signal 751 to control circuitry 746. Alternatively, the output pulses of the sequencer could be passed via connection 752 to control circuitry (included in controlled power source) for the same processing.

In an alternative embodiment of a device for measuring a timing-based indicator of power-supply level (voltage), the phase of the sequencer input, via connection 750, or filter output, via connection 749, could be compared to the phase of the preceding sequencer output, via connection 752, by using a delay circuit and a correlator to replace the function of ON time measurement. A high degree of correlation measured over several cycles is an indication that supply voltage needs to increase, while low or negative correlation indicates the contrary. This embodiment has the property that it will react more quickly when error signals are large than when they are small, which may be desirable for minimizing delay in response to large input signals.

An alternative indicator of incorrect power-supply level is the envelope of filtered error signal 408, 749. The magnitude of the envelope will tend to be high when the power supply level to the radio frequency gain stage (RFGS) is either, too low, or much too high. This non-monotonic characteristic makes it difficult to use the envelope of signal 749 by itself, because it is not clear whether the power supply level needs to be increased or decreased when the envelope of signal 749 is too large.

As suggested above, phase information in signal 749 can be used to disambiguate the "too-high" and "too-low" causes of the envelope of filtered error signal 749 having a high value. The phase of signal 749 may be compared to, either, its phase of prior cycles or to the phase of the input signal in order to make the determination.

In an alternative embodiment, input signal envelope information from envelope detector 741 (possibly via signal conditioning block 743) may be combined with envelope information from an envelope detector responsive to signal 749, along with system behavior knowledge that the error signal grows much more rapidly when the power supply level is too low than when it is too high. In this embodiment the output of envelope detector 741, possibly processed by signal conditioning circuit 743, is used to make an estimate of the required output level of controlled power source 745, while the presence of a large signal at 749 can be used as an indication that this estimate is too low. The presence of a large signal at 749 could, in one embodiment, increase the set point for controlled power source 745 by, e.g., up to 20%, thus allowing the system to work properly even when component variability causes power supply requirement estimates to be wrong by as much as 20%. In this latter situation, an open-loop envelope tracking system such as is known in the art would have to be designed with a 20% power supply margin, and would consume 20-40% more power as a result.

Thus FIG. 7 illustrates one or more of various embodiments of radio frequency power amplifier that includes a controlled supply that is arranged and configured to provide power, where the power (or level of the power) is controlled in accordance with one or more of: the input signal 405, e.g., envelope or the like, and various other signals. The other signals include an error signal based on the input signal and a feedback signal or a processed version thereof, e.g., filtered by the loop filter, etc., (or various characteristics of the error signal (amplitude or envelope, phase, changes over time), filtered or processed version of the error signal as modified in accordance with a sequencer feedback system (output of combiner 416), a change in some characteristic (state changes or sequence thereof) within the sequencer or at the sequencer output. Various examples have been discussed above.

The radio frequency power amplifier of FIG. 7 can be compared to the power amplifier of FIG. 6 (or further embodiment of FIG. 19, discussed below). The approach shown in FIG. 6 does not employ a sequencer with a quantized or hard limited output. In FIG. 6 or the embodiment shown in FIG. 19, an indicator of actual power supply level will be discussed where a third order harmonic is measured. With a quantized signal one expects a significant amount of harmonic content and thus this assessment of actual power supply level relative to a desired power supply level may not be reliable. FIG. 7 and the above discussion show various other approaches for assessing actual power supply level, e.g., timing or phase information obtained from one or more points within the feedback control system.

Figure 8:
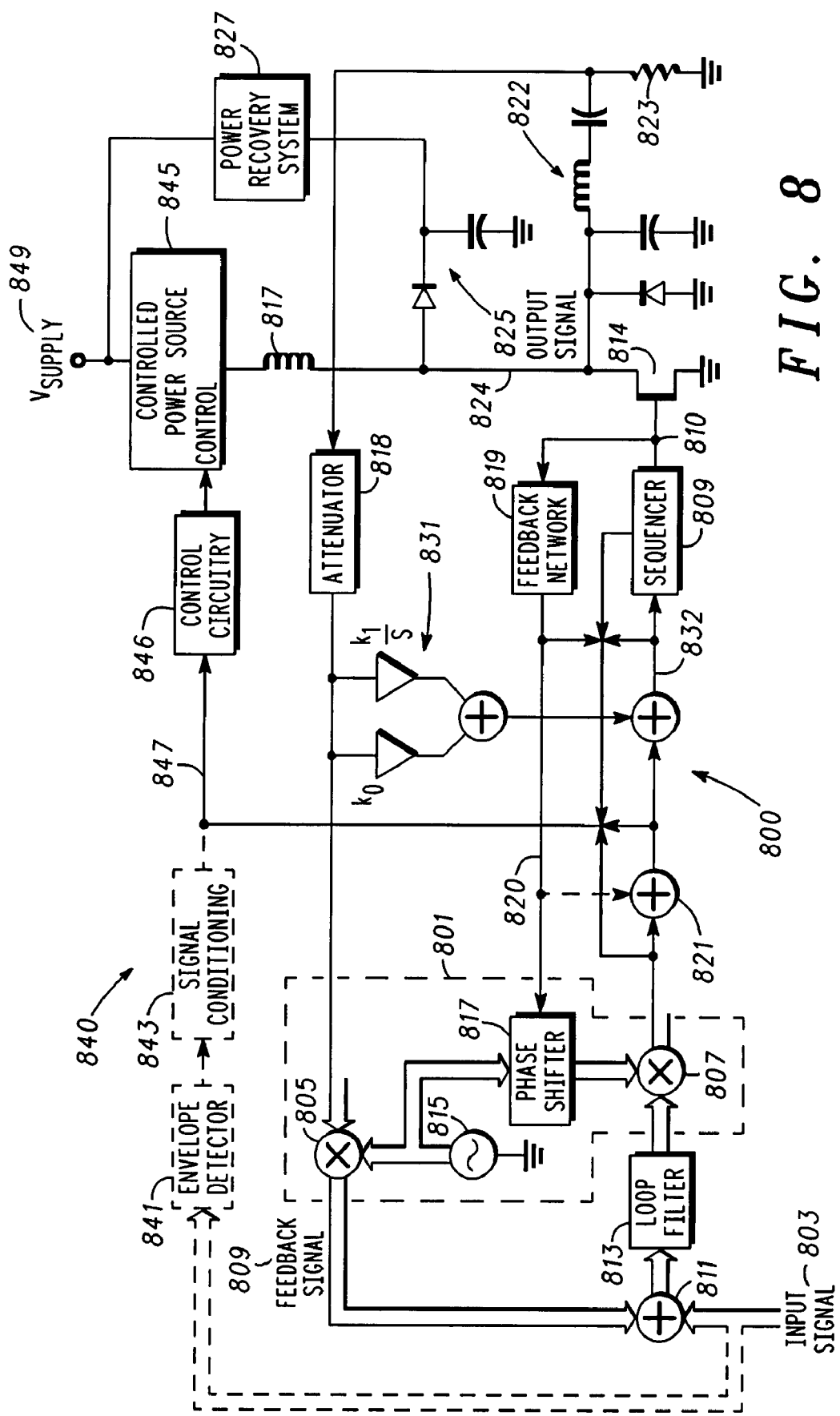
FIG. 8 depicts, in a simplified and representative form, a block diagram of a radio frequency power amplifier similar to that of FIG. 7 with the addition of a mixer arrangement according to one or more embodiments.

Referring to FIG. 8, a more detailed block diagram of a radio frequency power amplifier, similar to that of FIG. 7, etc, but including a mixer arrangement, in accordance with one or more embodiments will be discussed and described. This radio frequency power amplifier is shown with an amplitude limiting or control system or clipping system 825 as well as a power recovery system 827 that is coupled to $V_{SUPPLY}$ 849 or a supply voltage. Generally the cathode of the diode is held at a voltage that corresponds to a desired maximum voltage for the output signal 824 and the power recovery system can include a voltage converter that converts energy in the capacitor at the cathode of the diode into an appropriate voltage for the primary supply, $V_{SUPPLY}$ 849. In FIG. 8, the radio frequency power amplifier 800 includes in addition to the sequencer 809 (similar to, e.g., sequencer 409), switching or gain stage 814, resonant circuit 822, attenuator 818, a compensation function 831, a mixer arrangement 801, a feedback network or system 819, and a controlled supply 840. The sequencer 809, switching stage 814, resonant circuit 822, attenuator 818, etc. operate in accordance with previously discussed principles and concepts although they may be adjusted, etc. to accommodate the particulars associated with the embodiment of FIG. 8.

The radio frequency power amplifier 800 of FIG. 8 is arranged and constructed to receive an input signal 803 at a base band frequency, such as zero hertz or another intermediate frequency that is typically relatively low compared to the carrier frequency of the signal that is to be transmitted, frequency translate or up convert the input signal to a carrier frequency and amplify the resultant up converted signal to provide an output signal at 824 that is filtered, e.g., via resonant circuit 822 and coupled as a resultant signal to the load 823. The output signal will be at the carrier frequency and will include modulation corresponding to the input signal. Note that the input signal 803 is a complex signal with I (in phase) and Q (quadrature) components where the double lines in FIG. 8 are used to denote complex signals having I and Q components.

The mixer arrangement 801 includes linear I/Q mixers 805, 807 (e.g., Gilbert cell arrangements) and is configured to provide the feedback signal 809, where the feedback signal corresponds to the output signal at 824 or filtered output signal across the load 823 as frequency translated or down converted to the frequency of the input signal by the mixer arrangement or more specifically mixer 805. Note that under appropriate circumstances mixers other than Gilbert cells can be used. The feedback signal 809 is combined with the input signal 803 in the summer 811 with the resultant complex signal coupled to a loop filter 813. The complex conversion is a multiple mixer complex conversion providing two outputs coupled to two inputs of the filter so as to provide image rejection without undue delay as discussed in Section 9 of a University of Toronto, Department of Electrical Engineering Doctoral Thesis titled *Intermediate Function Synthesis*, authored by Snelgrove in December 1981, hereby incorporated herein.

The mixer arrangement further provides a sequencer input at input 832 that corresponds to the filter output or output signal from the loop filter 813 as frequency translated or up converted by the mixer arrangement 801, specifically mixer 807 to the carrier frequency, and as modified in accordance with the second feedback signal at 820 by combiner 821 and by the compensation function 831 via a combiner that provides the sequencer input 832. Note that only one of the complex signal components (I or Q) from mixer 807 is needed to drive the sequencer or alternatively combiner 821. In particular, the Q or imaginary component or alternatively the I or real component can be utilized; however the sequencer could be driven by a complex signal. Use of the complex signal may help in that, e.g., error-signal envelope information is readily available for use in controlling the controlled supply 840.

Thus the sequencer input or input signal corresponds to a combination of the input signal and the feedback signal as filtered and up converted. Note that the mixer arrangement may be viewed as part of the feedback control system of FIG. 1. Generally when the input signal is at base band, i.e. centered at DC or zero frequency, the loop filter may be advantageously implemented as a low pass filter and when the input signal is centered at another, e.g., intermediate, frequency the loop filter is normally implemented as a band pass filter centered at the intermediate frequency. Since the filter is handling complex signals both the I and Q component will need to be filtered prior to presentation to the mixer 807. In either situation the loop filter is configured to filter the combination of the input signal and the feedback signal. Using the mixer arrangement, while adding an apparent level of complexity, allows the loop filter to be implemented at a lower frequency and thus may allow for a more exacting or higher precision loop filter to be implemented/provided at lower costs. Using frequency translation in the feedback control system allows the input signal to be presented at base band and thus may eliminate the frequency translation at some other place in a typical transmitter lineup.

The mixer arrangement in addition to the mixers 805, 807 includes a local oscillator 815 that provides a local oscillator signal at a frequency equal to the carrier plus or minus the center frequency of the input signal. Thus if the input signal is at or centered at DC the local oscillator oscillates at the carrier frequency and otherwise at the carrier frequency plus or minus the intermediate frequency. The local oscillator signal is coupled to both mixers, however the signal coupled to mixer 807 is time-shifted or phase delayed by the phase shifter 817. The phase shifter 817 in some embodiments delays the oscillator signal to mixer 807 by approximately one-quarter cycle (at the carrier frequency) and forms the conjugate phase (the sign of the gain for the Q channel in the down conversion mixer 805 is opposite to the sign for the Q channel in the up conversion mixer 807) for the oscillator signal applied to the mixer 807 as compared to the signal applied to the mixer 805.

The time shift can be selected or adjusted to compensate for time delays in the feedback control system or loop or otherwise improve performance results in parameters such as signal to noise, linearity (noise plus distortion), stability, or the like. One approach for varying the time shift can utilize the second feedback system 819, which is responsive to the output signal from the sequencer and provides a control signal or second feedback signal at an output 820 to the phase shifter 817. This control or feedback signal can be used to provide or add to a phase shift to the local oscillator signal driving mixer 807. Thus the phase shift varies in accordance with the second feedback signal. This phase shift can be in lieu of or in addition to a fixed phase shift that was provided by the phase shifter 817. Note that the output of mixer 807 is the loop filter output signal as up converted or frequency translated and as modified in accordance with the second feedback signal. The second feedback signal can also be used in a further embodiment to modify or change the output signal (frequency translated loop filter output signal) from mixer 807 by coupling the second feedback signal 820 to combiner 821 where it is added to the output of the mixer 807 with the combiner then providing an input signal to the sequencer 809 (possibly via a combiner associated with the compensation function 831). The latter approach for affecting the signal at the input to the sequencer is similar to the approaches discussed with reference to, e.g., FIG. 4.

Thus the radio frequency power amplifier of FIG. 8 includes a feedback control system (801, 811, 813, 809) coupled to a signal corresponding to an input signal 803 and a first feedback signal 809 which is configured to provide a sequencer output at 810. Further included is a second feedback system 819 that is responsive to the sequencer output and configured to provide a second feedback signal at 820 that is coupled to the feedback control system, e.g., at phase shifter 817 or combiner 821; where the sequencer output has at least one state with a starting time that is determined by the feedback control system; and a radio frequency switching or gain stage 814 that is driven by the sequencer output and configured to provide an output signal, e.g., at 824, where the first feedback signal corresponds to the output signal or filtered output signal. The radio frequency power amplifier of FIG. 8 further comprises a mixer arrangement 801 that is configured to provide the feedback signal, where the feedback signal further corresponds to the output signal or filtered output signal as frequency translated by the mixer arrangement. The mixer circuits or arrangement furthermore provides a sequencer input 832 that corresponds to the filter output as frequency translated by the mixer arrangement and as modified, e.g., via the phase shifter or via the combiner, in accordance with the second feedback signal or as modified by the compensation function. The loop filter 813 can be a low pass filter or a band pass filter depending on the center frequency of the input signal.

The radio frequency power amplifier of FIG. 8 also includes one or more embodiments of a controlled supply 840. The controlled supply includes control circuitry or controller 846 which is configured to and provides a controller output signal or control signal to a controlled power source 845. The controlled power source is responsive to the controller (control signal) and configured to provide power, e.g., current, voltage, or combination, at a level that is controlled in accordance with one or more signals 847 at the input to the controller 846. One of the signals 847 can be a signal in accordance with the input signal 803, e.g., an envelope of the input signal as detected by envelope detector 841 and possibly as processed or conditioned by signal conditioner 843 (see above discussions with reference to FIG. 1 and FIG. 2). Other inputs can include a filtered version of an error signal (combination of the input signal and feedback signal) out of the loop filter 813 or, as depicted, the filtered error signal as frequency translated by mixer 807. Additional inputs can include one or more of the signal out of mixer 807 as modified by the feedback network 819 or as modified by the compensation function 831, or a signal from the sequencer. Generally the above discussion of FIG. 7 are illustrative of varying embodiments and the use thereof of these signals.

Time domain simulations of the radio frequency power amplifier 400 of FIG. 4 have been conducted using PC based circuit design and simulation software. For illustrative purposes, the system that was simulated produced a modulated output signal nominally centered at 875 MHz and processed an information signal comprised of 4 sinusoids arbitrarily spaced across a bandwidth of 11 MHz. The 4 sinusoid information signal is representative of the system processing an arbitrary wideband signal having a 6 dB peak-to-average power ratio. In addition, the switching stage 413 was an LDMOS FET having a 72 mm gate width. During the course of executing the simulations, system performance, i.e. signal-to-noise ratio, output load power efficiency and absolute output load power, was optimized by changing component values in an iterative manner through the application of electrical engineering principles. For comparison purposes, simulations were executed with a fixed supply voltage of 20 V to switching stage 413 through feed inductor 417 and for a the system as illustrated in FIG. 4 where the supply voltage to switching stage 413 was controlled in accordance with the envelope of input signal 405. In the latter case the supply voltage was controlled linearly with the input signal envelope but for low envelope levels where signal conditioning block 443 was employed to limit the lower excursions of the supply voltage; thus, the supply voltage applied to the supply side of feed inductor 417 varied from lower limited level of 0.75 V up to 20 V. In both simulations a signal-to-noise ratio of approximately 51 dB over a 15 MHz bandwidth and an output load in band signal power of 14 Watts was achieved. The power amplifier efficiency in the case of a fixed voltage supply was 21.5%, while with a controlled voltage supply the efficiency was 40% (ignoring supply efficiency). Other particulars of the simulations include a feed inductor 417 of 9 nH (nano-henrys), a load resistance of 50 Ohms, a resonant output circuit transforming a 3 Ohm impedance to 50 Ohms, a multi-stage driver circuit at the input to switching stage 400, along with representative parasitic components and values.

In contrast to these results, a Class A amplifier in a similar comparison circuit with a fixed power supply, with similar input signals and output signal power and linearity may be expected to achieve a power efficiency of approximately 7 to 8 percent. Note that further optimization work may yield different performance results and component values. One of ordinary skill will realize that more detailed models may be required and that different performance values may be obtained, for example, at other frequencies.

Figure 9:
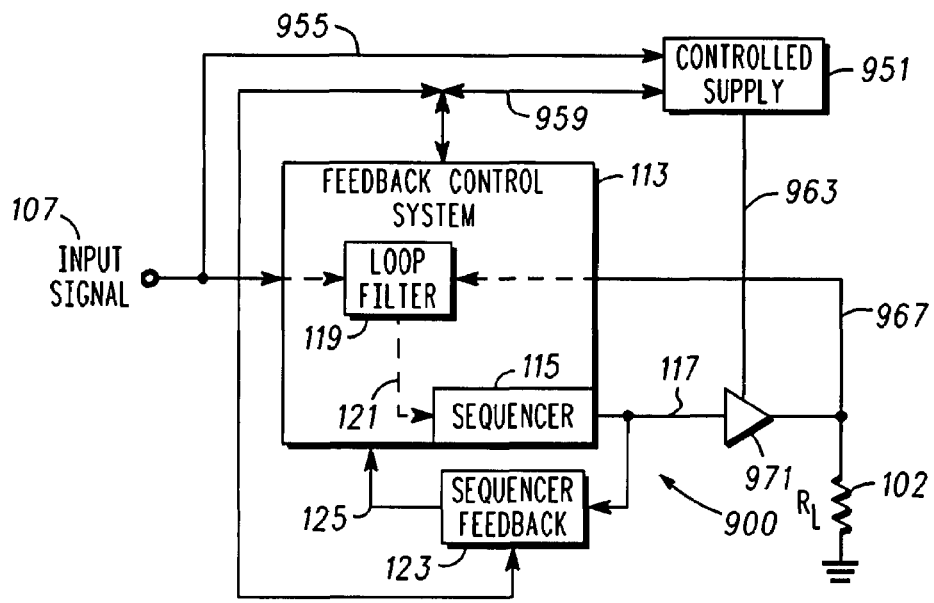
FIG. 9 shows a generalized and representative block diagram of a radio frequency power amplifier using a controlled supply and one or more feedback control systems in accordance with one or more embodiments.

Referring to FIG. 9 a generalized and representative block diagram of a radio frequency power amplifier including a controlled supply and one or more feedback control systems in accordance with varying embodiments will be discussed and described. Some of the discussions above and below can be referred to for additional details. FIG. 9 illustrates various elements that were shown and discussed with reference to FIG. 1, e.g., the feedback control system 113, sequencer feedback 123, etc. FIG. 9 illustrates a radio frequency power amplifier 900 which comprises a feedback control system 113 coupled to an input signal 107 and a first feedback signal 967 and configured to provide a sequencer output having an average occurrence rate in accordance with the input signal; a controlled supply 951 that is configured to provide power, e.g., at output 963, that is controlled in accordance with the input signal, e.g., an envelope of the input signal; and a radio frequency gain stage (RFGS) 971 that is powered via 963 from the controlled supply 951, driven by the sequencer output, and configured to provide an output signal, e.g., to a load 102, where the first feedback signal 967 corresponds to the output signal.

The controlled supply can be a voltage source, current source, or combination with the particular arrangement selected to be compatible with the power requirements or needs of a particular RFGS. Often the controlled supply will be a voltage source with a series choke or inductor to form effectively a current source at the frequency of the carrier. The RFGS can be a switching stage or linear, quasi linear (A, AB, B, C), or quasi switching stage and may be comprised of a series of gain stages and parallel gain stages as may be expected in a normal radio frequency power amplifier lineup.

In other embodiments the controlled supply can be responsive to one or more signals 959 received from the feedback control system 113 (see above discussions) and can provide one or more signals 959 to the feedback control system 113 or to the second feedback system or sequencer feedback 123 (see additional discussions and FIGs below). Signals 959 that are provided are expected to vary in accordance with the variation in the power supplied by controlled supply 951. An envelope of the input signal 107 is an estimation of the power supplied and variations therein. An error signal in a closed loop controlled supply (see e.g., FIG. 4) or signal corresponding to the power supplied can be a better control signal 959 in some instances. The control signals 959 are normally varying at the rate of the envelope of the input signal, however it may be useful to use a control signal that is averaged over a longer term. Thus the control signals 959 may be one or more of or a combination of the envelope at the output of the envelope detector, the output of the signal conditioning block or the controlled power source (perhaps the error signal from a closed loop controlled power source, or the actual output signal of the controlled power source). It is also noted that one embodiment contemplates implementing the feedback control system, sequencer feedback as well as much of the processing, etc associated with the controlled supply in one or more integrated circuits.

From an ideal or theoretical perspective, consider the case of a controlled supply 951 whose output 963 is ideally linearly proportional to the envelope of the input signal 955. If the sequencer 115 has only two output states (ON/OFF or the like) and the RFGS 971 and Sequencer Feedback 123 have responses that are scaled linearly with controlled supply power at 963, then scaling the power at 963 for a fixed sequencer output scales all feedback inputs to feedback control system 113. Under these conditions, scaling input signal 955 results in linearly scaling all of the inputs to feedback control system 113 together, and if loop filter 119 is linear then this also scales filter output 121 for a scaled input and fixed sequencer output 100. Now if sequencer 115 is only responsive to the sign of its input (triggered by zero crossings), its output or output sequence at 117 will be fixed regardless of any (positive) scaling of its input.

This combination of conditions on the amplifier of FIG. 9 has the consequence that scaling the input signal results in perfectly scaling the output signal, with the valuable result that quantization noise scales with signal input, and thus that the system maintains constant signal-to-noise as signal levels are varied. Furthermore, the efficiency of the radio frequency power amplifier should be improved with the overall efficiency being impacted by the implementation of the controlled supply or controlled power source therein. Even if the controlled supply includes a linear regulator, gains in power amplifier efficiency can be realized and if a switching regulator is utilized greater gains in efficiency will be realized.

In a practical system the conditions of ideal scaling described above will not apply, but it will (usually) be advantageous to approximate them in order to obtain near-constant signal-to-noise ratio over a range of input signal levels. One or more of the signals 959 can be used to adjust parameters of feedback control system 113 and Sequencer Feedback 123 and this provides a collection of techniques to approximate the proper scaling behavior.

In one embodiment a signal 959 is coupled to the Sequencer Feedback 123 as a control signal and uses the control signal to linearly scale its output signal or voltage 125 (via a variable gain amplifier or the like) with the controlled supply output voltage or power at 963. This can result in advancing or retarding, relative to not scaling the output signal, the trigger point of the sequencer. Referring to the theoretical perspective above, in order to keep SNR constant as the envelope changes, given the loop filter output will be scaling exactly with the envelope (both the input and feedback signals are scaling precisely the same) and the sequencer output amplitude is fixed (for example the case of a one-shot sequencer), one needs to ensure that the rising edge zero crossing trigger points remain unchanged. Thus the sequencer feedback signal should also be scaled with the envelope, i.e., all inputs to the sequencer need to scale to ensure that the sequencer generates the same output sequence so that SNR is held constant despite a varying envelope on the input signal.

In other embodiments a signal or control signal 959 can be used to compensate for different propagation times of the RFGS due to changes in its voltage or power supply level. In a typical RFGS 971 a variation in the propagation time through the RFGS will be observed with a changing controlled supply voltage 963. An example of such an effect in the context of a switching RFGS is that a transistor with a fixed input level will typically switch more rapidly with a low supply voltage at its drain than with a high supply voltage at its drain. This change in switching speed is not a mathematically linear effect and thus is a non-ideality that may need to be corrected.

In various embodiments one or more control signals 959 varying in accordance with the controlled power level or the power at 963 can be used to compensate for the variation in the propagation time through the RFGS. For example scaling the drive level into the RFGS 971 by adjusting the output level of Sequencer 115 responsive to the control signal 959, and/or scaling the drive level of one or more of the stages of the RFGS 971 (also see the discussion below with reference to FIG. 11) by adjusting the supply level to a plurality of stages can help compensate for or mitigate variations in propagation time.

Figure 16:
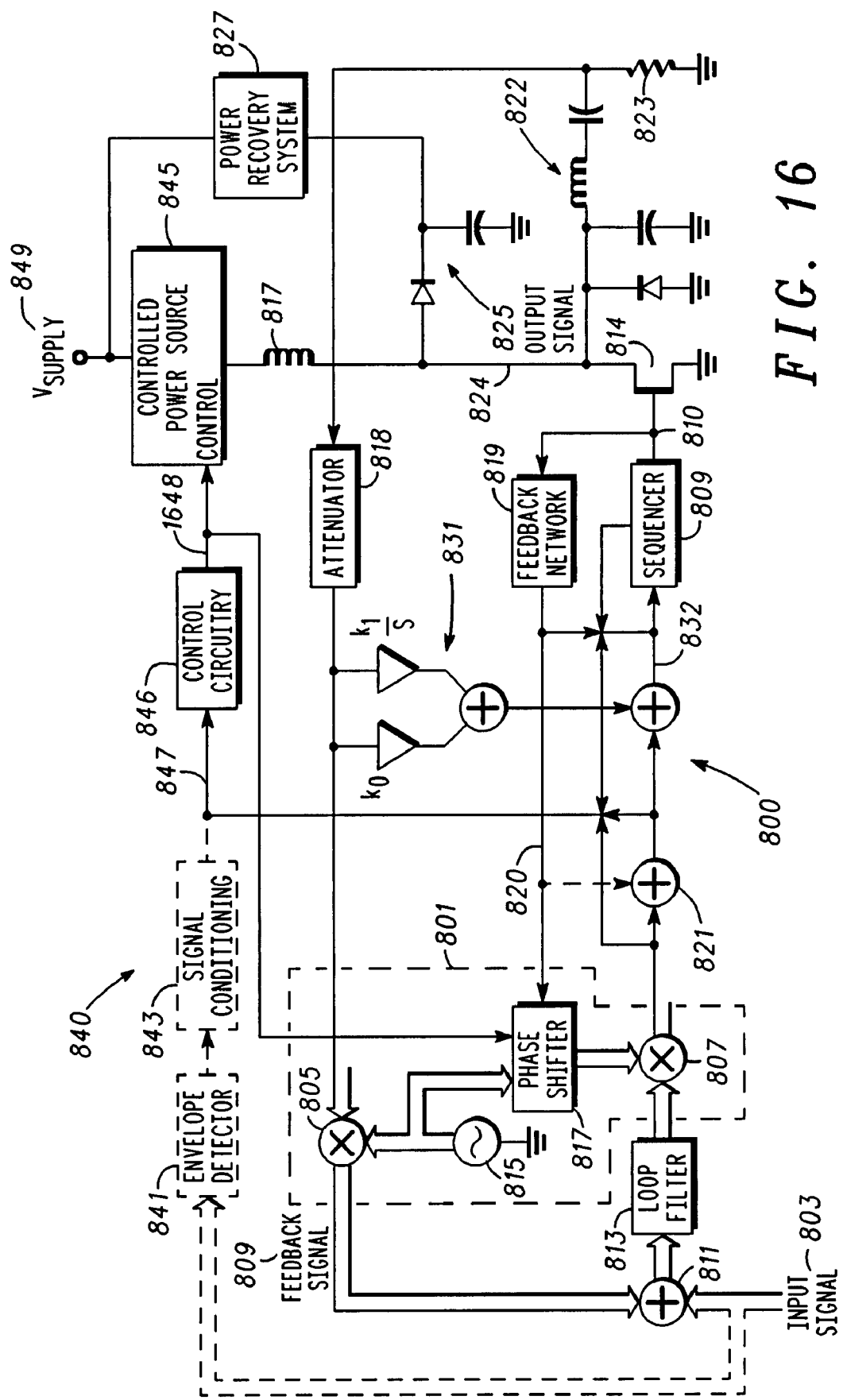
FIG. 16 illustrates a block diagram of a radio frequency power amplifier similar to the FIG. 8 with a control signal being provided to a feedback control system in accordance with one or more embodiments.

In other embodiments a control signal 959 varying with the controlled supply power can also be used to compensate for variation in the propagation time through RFGS 971 by providing a mechanism within feedback control system 113 that advances or retards the timing of its output in accordance with the control signal 959. FIG. 8 illustrates an embodiment where the timing of the output of feedback control system 113 is varied by changing the phase of Phase Shifter 417 in accordance with an output from the feedback network 419 or sequencer feedback. FIG. 16 (discussed below) shows an embodiment where a control signal from the controlled supply is used to directly adjust the phase or timing of, e.g., feedback control system 113.

Another embodiment to compensate for variation in propagation time through the RFGS is altering the zeros of loop filter 119. In this embodiment the timing of the output of feedback control system 113 is varied with a control signal 959 that varies with the controlled supply power. For example, if loop filter 119 is implemented using analog circuitry, the zeros of the Loop Filter can be adjusted using analog multipliers such that the group delay of the filter is reduced when controlled supply levels 963 are high and propagation delay through RFGS 971 increases.

In other embodiments a control signal 959 varying with the controlled supply power level can be used to vary parameters of the sequencer output (trigger points, ON or OFF times, and levels) one or more or which can compensate for variations in propagation times as the controlled supply power varies.

Generally, the transfer function of the RFGS is a function of the level of it supply voltage (or current) (Vdd). Ideally, the gain of the RFGS varies precisely proportionally to Vdd. Practically, not only does the gain not vary precisely proportionally to Vdd, other characteristics of the RFGS will vary with Vdd, for instance, the phase response of the RFGS. In general, variation in the RFGS response in the absence of compensation can result in reduced system performance, e.g., reduced linearity (SNR), lower output power and/or efficiency. However, when the variation in the RFGS response is known, or can be predicted and appropriately compensated for, improved system performance can be expected.

Typically, a feedback control system is designed to ensure that the loop is stable over anticipated changes in operating conditions, i.e. variations in temperature, component aging, etc. One metric employed in the design of a feedback control system to measure the robustness of the loop to changes in operating conditions is the loop's phase margin. When the phase response of the loop transfer function changes (all other loop parameters and characteristics being equal), the loop will remain stable as long as the phase change is less than the phase margin. Since the phase response of the RFGS will be a function of its supply level, in the presence of a controlled supply it may be necessary to dynamically compensate for phase variation in the RFGS to ensure that the feedback control system remains stable, i.e. sufficient phase margin is maintained.

Figure 10:
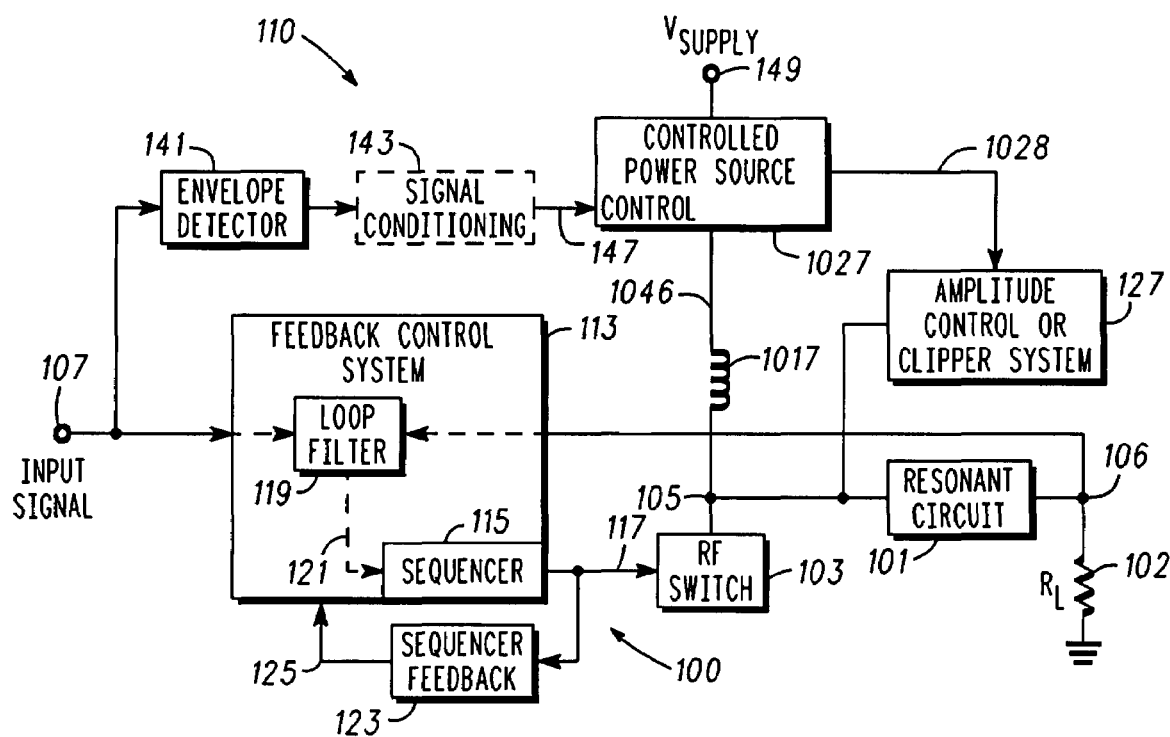
FIG. 10 illustrates a simplified block diagram of a radio frequency power amplifier, which is similar to FIG. 1 with the addition of an amplitude limiting system, in accordance with one or more embodiments.

Referring to FIG. 10, a block diagram of a radio frequency power amplifier, which is similar to FIG. 1 with the addition of an amplitude limiting system, in accordance with one or more embodiments will be discussed and described. The discussion referring to FIG. 1 can be referred to for various details and need not be repeated here. FIG. 10 shows a controlled power source 1027 that provides in addition to power at a controlled level a control signal 1028 to the amplitude control system 127. As the power level changes at 1046 the power or current conducted through choke 1017 will also change. As a result the voltages of the output signal at 105 will change also. It may still be desired to clip these voltages at a level that is a function of the actual power or voltage being supplied by the controlled power source. For example, maintaining linear scaling of signals in radio-frequency components 103, 101, 102, etc. with supply voltage variations may require that the level at which voltage signal 105 is clipped be scaled linearly with supply voltage 1046. Control signal 1028 is used to control the level of voltage clipping performed by amplitude limiting system 127. Thus the control signal 1028 is provided to the amplitude limiting system 127 and used to change a clipping level (e.g., bias level on a cathode of a diode).

Figure 11:
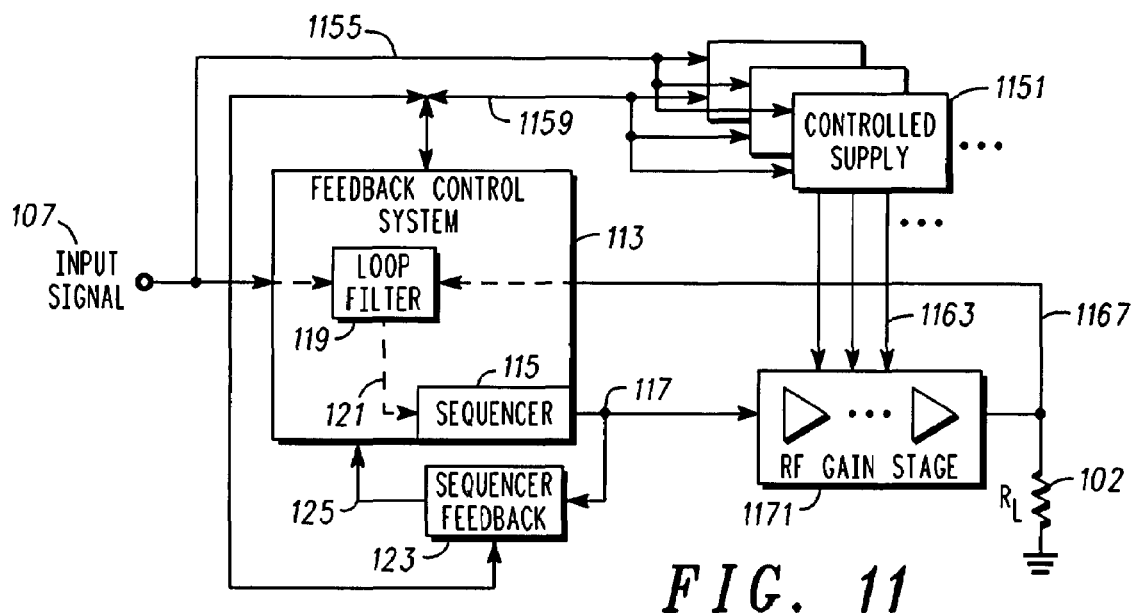
FIG. 11 shows a simplified and representative block diagram of a radio frequency amplifier using a controlled supply, which is similar to FIG. 9, in accordance with one or more embodiments.

Referring to FIG. 11 a simplified block diagram of a radio frequency power amplifier including a controlled supply, which is similar to FIG. 9, will be discussed and described. FIG. 11 shows a controlled supply 1151 that is a plurality of controlled supplies with each coupled to an input signal 107 at 1155 and one or more of the controlled supplies is intercoupled to the feedback control system 113 and sequencer feedback 123. Each of the controlled supplies is shown providing power at 1163 to an RFGS 1171, which is comprised of two or more gain stages that collectively operate to provide an output signal 1167. The output signal 1167 is used as or corresponds to an input to the feedback control system 113. One of the plurality of controlled supplies provides power to a final gain stage(s), while others provide power or bias levels to other gain stages, e.g., driver or pre-driver stages. The plurality of controlled supplies in some embodiments can be implemented essentially as one controller and a plurality of regulators, etc.

Figure 12A:
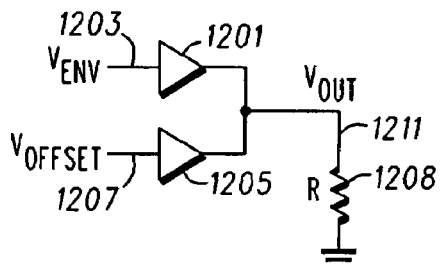
FIGS. 12A-12B show block diagrams of signal conditioners that may be used in one or more embodiments of controlled supplies in accordance with various embodiments.
Figure 12B:
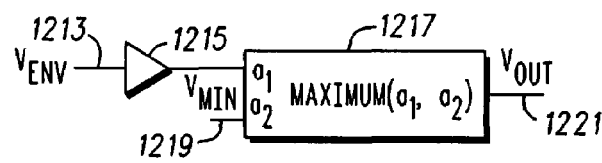

Referring to FIG. 12, block diagrams of signal conditioners that may be used in controlled supplies will be discussed and described. FIG. 12A shows an embodiment that may be implemented in an analog circuit and includes a first transconductance amplifier 1201 with a transconductance of $gm_1$ which is coupled to an envelope signal ($V_{Env}$) 1203 (from an envelope detector) and a second transconductance amplifier 1205 with a transconductance of $gm_2$ that is coupled to an offset voltage ($V_{Offset}$) 1207. The outputs of both amplifiers are coupled to a load 1209 and provide an output voltage ($V_{out}$) 1211. The output voltage $V_{out} = K \times V_{Env} + V_{offset}$, where $gm_1 \times R = K$ and $gm_2 \times R = 1$ FIG. 12B illustrates an embodiment that can be implemented in a digital signal processor. An envelope signal $V_{Env}$ is multiplied by G with the result $G \times V_{Env}$ supplied to a Maximum selecting function 1217 along with a minimum voltage $V_{Min}$ 1219. The Maximum selection results in Vout 1221. Thus Vout is $G \times V_{Env}$ when this is larger than $V_{Min}$ else Vout is $V_{Min}$. Those of ordinary skill will appreciate that other embodiments for performing other signal conditioning processes can be utilized.

Figure 13:
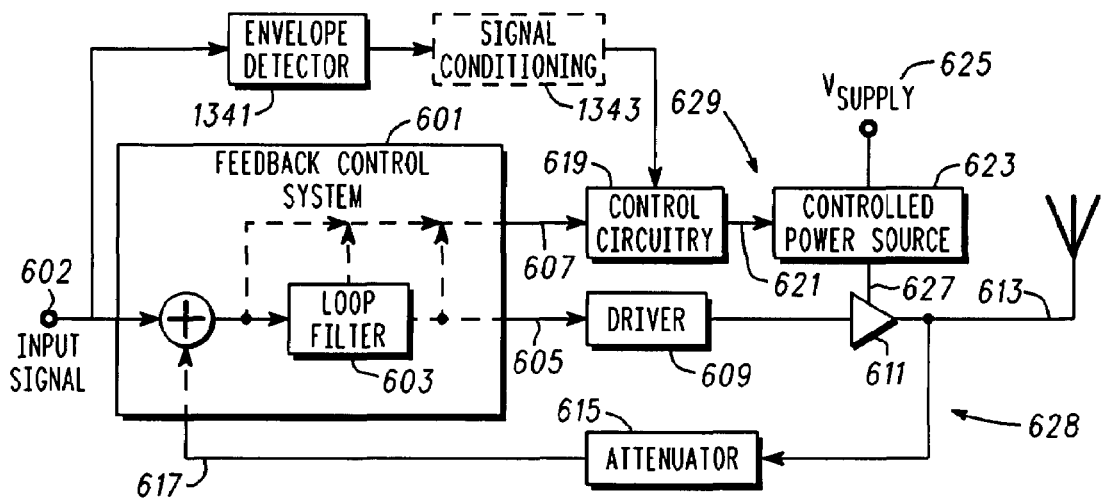
FIG. 13 illustrates a simplified and representative block diagram of a radio frequency power amplifier similar to FIG. 6 but also using an envelope signal in accordance with one or more embodiments.

Referring to FIG. 13, a simplified and representative block diagram of a radio frequency power amplifier similar to FIG. 6 but also using an envelope signal in accordance with one or more embodiments will be discussed and described. The controlled supply and specifically the controlled power source 623 and control circuitry 619 of FIG. 13 can be similar to that of FIG. 6, however it is unique in that an additional signal corresponding to an envelope of input signal 602 as provided by envelope detector 1341 and possibly as conditioned by signal conditioner 1343 is an input to the control circuitry 619 or controller.

The envelope of input signal 602, as suggested above, can be a good estimate, i.e., predictor or precursor, of the power at 627 which will be required by the driver 609 and power amplifier 611 or balance of the radio frequency power amplifier to faithfully replicate the input signal at the output 613 and maintain appropriate performance criteria (S/N, stability, etc.). Specific issues for a particular power amplifier and system that are predictable can be addressed by the signal conditioner (offset, clipping, filtering, delays for phase alignment, other linear or non-linear changes) operating to modify the envelope signal. The envelope signal is available or can be made available before any error signals 607 have built up or become reliable indicators, since the feedback loops (lower amplifier radio frequency loop 628 and upper controlled supply loop 629) will incur some delay in responding to an input signal. On the other hand the envelope signal is only an estimate and is an open loop system and therefore unlikely to provide performance as accurately and repeatably as the closed or feedback loop systems.

Thus the radio frequency power amplifier of FIG. 13 relies on the envelope signal to either establish initial or new parameters for the control loops, e.g., a controlled supply level, etc. and the error signals and feedback loops for the final parameters. Note that this can include simply biasing control decisions, e.g., in the control circuitry in a likely direction based on the envelope indication. For example, if the envelope signal indicates a significant change in the envelope amplitude, the controller or control circuitry 619 can drive the controlled power source to a corresponding power, prior to seeing a significant change in the error signal 607. Alternatively, the control circuitry can bias a power level in a direction of change of the envelope signal by adding a portion of the envelope signal to the error signal 607 at least temporarily. This feedback approach for controlling power can allow the overall radio frequency power amplifier to operate much closer to an ideal point over a much larger range of input signals and other variations.

Figure 14A:
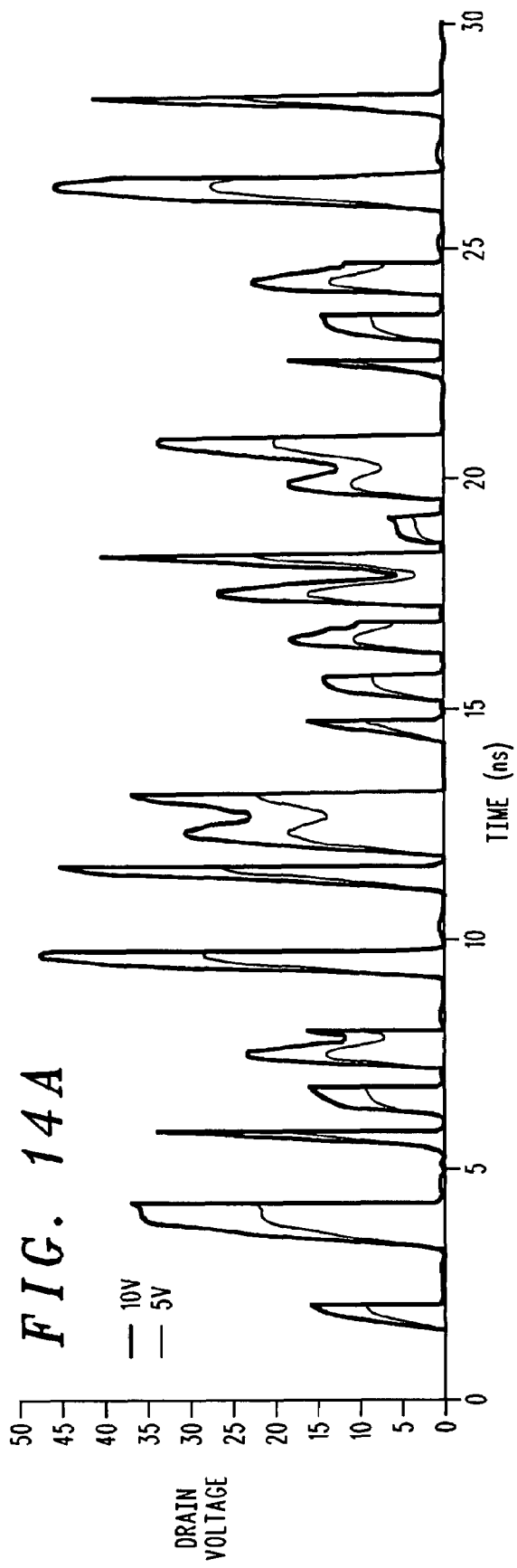
FIG. 14A and FIG. 14B illustrate simulation results of a radio frequency amplifier with different power supply levels.
Figure 14B:
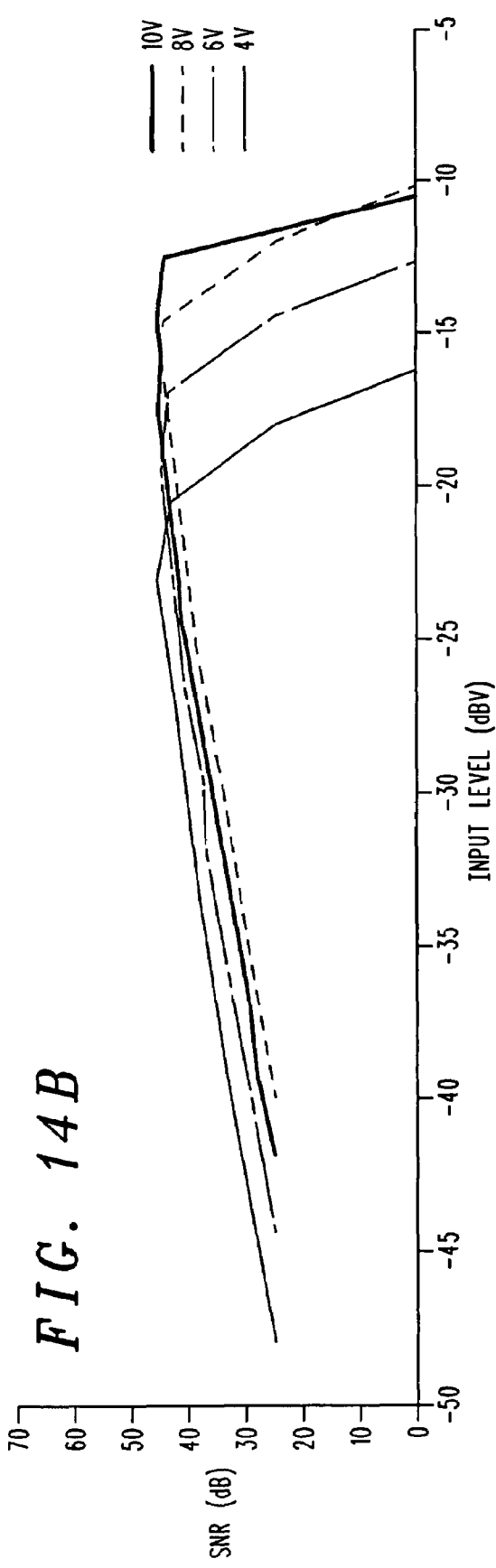

Referring to FIG. 14A and FIG. 14B some simulation results will be discussed. In the prior discussions referencing FIG. 9, it was noted that scaling the input signal (varying the amplitude) results in perfectly scaling the output signal (given a properly controlled supply), with the valuable result that quantization noise scales with signal input, and thus that the system maintains constant signal-to-noise ratio (SNR) performance as signal levels are varied. These FIGs. illustrate this point. FIG. 14A illustrates this point with a simulation result based upon the power amplifier shown in FIG. 8. The simulation is performed at different power or voltage levels, i.e., power supply control has been disabled. The power or voltage supply 849 is connected directly to choke 817. In addition, device 814 operates as an RF switch modeled as an ideal switch in series with an ideal 0.125 Ohm resistance when the switch is closed. The time-domain behaviour of the system is shown in FIG. 14A for voltage supply levels of 6 V and 10 V, and for input signals scaled accordingly. It can be seen that the waveforms are purely scaled versions of each other, as theory predicts.

FIG. 14B shows via simulation results how SNR varies with input signal level at various fixed voltage supply levels for the ideal switch model. Each curve shows a classic "escarpment" shape, with SNR improving as signal level is increased up to a limiting level, after which it drops precipitously. The four curves can be seen to be essentially shifted versions of each other. The SNR curves of FIG. 14B suggest that the level of voltage supply could be advantageously modified according to signal level so as to optimize SNR for any signal level. For example, if the input signal level is −23 dBV, a 4 V voltage supply level is desirable; but if the input signal level is −17 dBV, an 8 V voltage supply level provides better SNR.

Controlling the voltage supply level such that it tracks the envelope of the input signal for the purpose of increasing efficiency is generally known. FIG. 14B shows that controlling the voltage supply level can also be effective in providing SNR enhancements for some radio frequency power amplifiers, e.g., switching-type power amplifiers.

Referring to FIG. 15A and FIG. 15B additional simulation results will be discussed. As noted above, in a practical system these conditions of ideal scaling will not always apply, but may be approximated. FIG. 15A shows results of a time-domain simulation similar to that described above and used to generate the results of FIG. 14, however the model of device 814 was changed from an ideal switch to a simple field-effect transistor. FIG. 15A and FIG. 15B show results for different voltage supply levels. In the case of the time domain results of FIG. 15A, it can be observed that the first pulses are approximately properly scaled in the two cases, but there after the circuits behave quite differently.

FIG. 15B shows SNR versus input signal level curves corresponding to the same supply voltage levels used to generate the results of FIG. 14B, but with the field-effect transistor model for device 814. The curves still have a rough escarpment shape, although the limiting behavior for high input signal levels is more gradual. Furthermore the curves are no longer purely shifted versions of one another. Note that, for SNR purposes, it is now never desirable to choose an 8 V supply voltage because there is no input signal level at which SNR is better than the SNR for one of the other supply voltage levels. Power supply control is still desirable for a −30 dBV input, though, where a 4V supply voltage level is substantially better than a 10 V level.

The lower supply voltage levels in the case of FIG. 15B are still effective for efficiency improvements, even when they may not improve SNR performance, and thus can be valuable in addressing efficiency or device heating concerns.

Referring to FIG. 16 a block diagram of a radio frequency power amplifier similar to FIG. 8 with a control signal being provided to a feedback control system in accordance with one or more embodiments will be briefly discussed and described. In FIG. 16, a control signal at 1648 is coupled to phase shifter 817 and is used to adjust the phasing or timing (advance or retard) of the sequencer output at 810. As noted above in the discussions referring to FIG. 9, this can be used to compensate for or mitigate results of propagation delays through an RFGS, which change with varying controlled supply levels.

Referring to FIG. 17, a more detailed block diagram of a radio frequency power amplifier 1700 including a controlled supply 111 and one embodiment of a sequencer will be discussed and described. The radio frequency power amplifier 1700 functionally includes many of the same entities as, e.g., FIG. 4 and others and thus this description will not dwell on many of them. An embodiment of a controlled supply 111 including controlled power source 1750 which is configured for controlling some functionality of sequencer 1709 is also shown and will be discussed. The radio frequency power amplifier 1700 includes a loop filter 1701 (normally nth order band pass filter in this embodiment) with an input 1703 coupled to a signal corresponding to an input signal 1705 and a feedback signal 1707. Further included is a summer or combiner 1716 and a sequencer 1709 where the combiner is responsive to a second feedback signal 1714 from a feedback system, e.g. sequencer feedback 1712, and a filter output, e.g., via output/input 1708, from the loop filter 1701 or loop filter output signal. The sequencer 1709 is configured to provide a sequencer output at output 1711, where the sequencer output has an OFF state with a starting time that corresponds to the filter output signal and the second feedback signal (i.e., there is a defined relationship between the filter output signal plus second feedback signal and operation of the sequencer and thus sequencer output). Additionally included is a radio frequency switching stage or RFGS 1713 driven by the sequencer output and configured to provide an output signal at output 1715 that is coupled via the attenuator 1718 to the summer 1719. Thus, the feedback signal 1707 corresponds to the output signal as amplitude limited or clipped by amplitude limiting system 127. Note the OFF state corresponds specifically to RFGS 1713 being opened or in a high impedance state, i.e., OFF state.

The radio frequency stage 1713 is powered from controlled power source 1750 via a feed inductor 1717 and is coupled to the amplitude limiting system 127 which is arranged and configured to limit or constrain a peak or maximum amplitude of the output signal at 1715 in accordance with or dependent on a signal at 1728, which varies with a power level or voltage level provided by the controlled power source. The stage 1713 is also coupled to and drives a resonant circuit 1721 comprised of a series resonant inductor capacitor pair 1727 and capacitor 1731 that operates to filter the output signal and drive a load 1723. A catch or snub diode 1725 is located as shown in parallel with the RF stage 1713. The stage 1713 with the resonant circuit 1721 will be recognized as a radio frequency amplifier that can as known be arranged in or similar to a class E configuration with appropriate values of the inductors and capacitors given a frequency of interest.

The sequencer 1709 further comprises a flip flop, such as a D flip flop 1731 or other appropriately arranged flip flop or the like that is clocked, for example, from the combiner output at input 1732. The sequencer 1709 is configured to provide the sequencer output in the OFF state (low voltage state) when triggered by the combiner 1716, i.e., the OFF state has a starting time that corresponds to the combiner output. Note in this embodiment, when the output signal at 1708 from the loop filter 1701 plus the second feedback signal 1714 crosses a switching threshold at a clock input 1732 of the D flip flop, the Q output 1733 goes high (Vcc since the D input is tied to Vcc) and the Q bar output 1735 goes low. When the Q bar output 1735 or sequencer output at 1711 goes low (OFF state), a switch 1737 is opened.

The open switch 1737 allows a capacitor 1739 to begin charging through a resistor 1741 towards the voltage level of controlled power source 1750 output 1743. The junction of the capacitor and resistor is coupled to a Reset input 1743. When the capacitor has charged to the Reset threshold of the D flip flop 1731 at a time determined by the RC time constant of resistor 1741 and capacitor 1739 and voltage level of controlled power source 1750 output 1743, the D flip flop will be reset and the Q bar output will go high, the switch 1737 will be closed holding the Reset input at a low potential, and the sequencer will thus provide the sequencer output at 1711 in an ON state (stage 1713 is ON) after a time lapse determined by the Reset signal for the D flip flop. Thus the timing associated with a sequencer output state (duration of the OFF state or beginning of the ON state) can be controlled (advanced or retarded) in accordance with or dependent on a signal 1743 that varies with the power or voltage level provided from the controlled supply 111 This sequencer 1709 is often referred to as an edge triggered one shot. It has been found that a time lapse on the order of a half cycle of the radio frequency carrier can be an appropriate time duration for the OFF state, e.g., at 1000 MHz, approximately 0.5 nanoseconds. After the D flip flop has been reset, when the combiner output again goes high, the sequencer 1709 will again provide an output in the OFF state.

Figure 18:
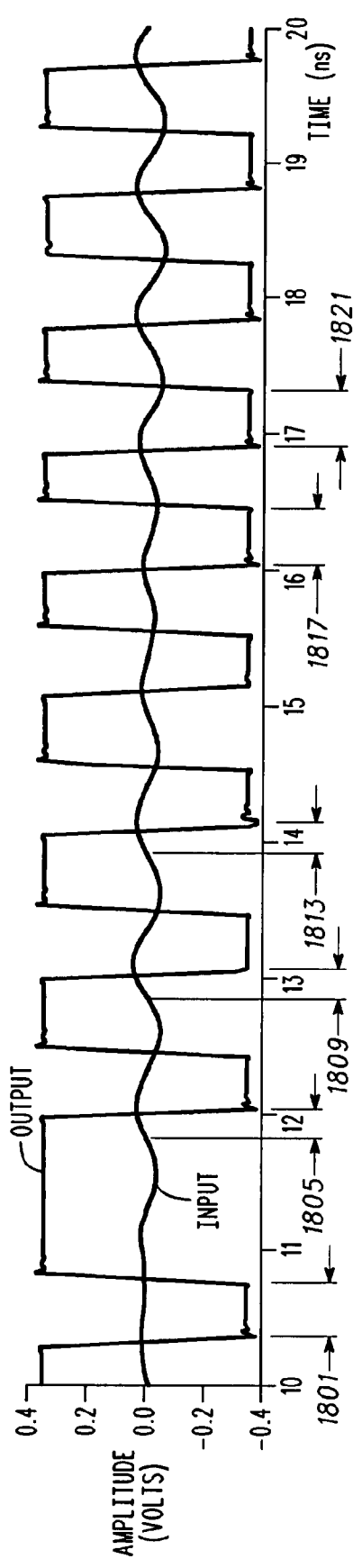
FIG. 18 illustrates a representative sequencer output in the FIG. 17 block diagram.

Referring additionally to FIG. 18, prototypical voltage waveforms of the sequencer input 1732 and output 1711 are shown. A rising edge zero crossing on input 1732 drives the sequencer output 1711 into the OFF state, i.e. 2001, 2017, and 2021, etc. Note that a finite response time and propagation delay through the sequencer is shown in the waveforms of FIG. 18, i.e. time periods 1805, 1809, and 1813, etc. The duration of each OFF state shown in FIG. 18 is equal because the voltage level on controlled power source 1750 output 1743 is held constant.

When controlled power source 1750 is active and the power supply level to stage 1713 and resonant circuit 1721 is varying, the response from sequencer output 1711 to load impedance 1723 will also vary. For instance, the propagation time through stage 1713 will depend upon the voltage at output 1715. The variation in the response from sequencer output 1711 to load impedance 1723 may be compensated by various means, with one such means being to change the duration of the OFF state in accordance with the power level supplied by controlled power source 1750 to stage 1713 and resonant circuit 1721. The duration of the OFF state is controlled by the voltage level of output 1743 of controlled power source 1750 since the voltage provided to resistor 1741 is dependent thereon and this establishes the time duration for capacitor 1739 to charge to the reset threshold of D flip flop 331. Thus the duration of the OFF state, 1801, 1817, 1821, etc. will change depending upon the voltage level of output 1743 of controlled power source 1750.

Note that when the sequencer output is in the OFF state, the switching stage is an open circuit, i.e., stage is turned OFF, and the resonant circuit 1721 may be charging up through the feed inductor 1717 or the inductor capacitor pair may be charging up capacitor 1731 thus causing a positive going pulse in the output signal at 1715. Conversely when the sequencer output is in the ON state, the switching stage is a short circuit, i.e., the switching stage is turned ON, the output signal at 1715 is approximately zero volts, and the resonant circuit 1721 may be discharging through the switching stage. The specific voltages associated with ON or OFF states can be determined by specific technologies that are being utilized for the sequencer as well as the switching/gain stage(s). For example, when depletion mode devices are used for the switching stage the OFF state for the switching device can be approximately −2 volts while the ON state can be between 0 and 0.5 volts. The sequencer and various driver stages will need to be fashioned to provide the appropriate drive signal to the switching stage(s).

For high-frequency operation, an appropriate sequencer operates in an asynchronous manner, i.e. there is no clock as in conventional architectures. Note that for reasonable efficiency when reproducing input signals it is necessary that the sequencer output produce a drive signal for the class E/F amplifier that is compatible with its requirements, e.g., switching at or near zero voltage, etc. This normally means that the sequencer will need to switch at or near the carrier frequency and that the sequencer will need to vary or modulate the timing of its switching decisions with a resolution that is fine in comparison with the period of the carrier, e.g. at ⅛ or smaller increments of the period. This is in stark contrast to conventional feedback architectures, such as sigma-delta architectures, which are synchronized to a clock that is independent from and thus whose phase relationship to the carrier is essentially random.

Thus, the sequencer 1709 should, in embodiments where efficiency is desired, be configured to provide the sequencer output with a second state, e.g., ON state, that has a starting time corresponding to, e.g., at or near to or on average at or near to, a voltage minimum for the output signal. As discussed above, the sequencer in certain embodiments is configured to provide the sequencer output where the OFF state has a minimum time duration (e.g., determined by the RC time constant and voltage level of controlled power source 1750 output 1743) and the sequencer output further has an ON state having a variable time duration (in the described and various embodiments the ON state once it begins will last until the output of the combiner 1716, i.e., output of the loop filter as modified in accordance with the second feedback signal, triggers the D flip flop). In the embodiment noted above, the sequencer is configured to provide the sequencer output with an OFF state having a time duration determined by the RC time constant and voltage level of controlled power source 1750 output 1743.

Note that other embodiments may use a sequencer that is configured to provide the sequencer output with an OFF state having a variable time duration where the variable time duration is equal to or greater than the time duration determined by the RC time constant and voltage level of controlled power source 1750 output 1743. For example a pulse generator 1745 (optional) that is triggered by a positive going output or some predetermined state from the combiner or loop filter to provide a negative going pulse at the Reset input and otherwise provide an open circuit will discharge capacitor 1739 and thus provide a variable time duration for the OFF state that is longer than the time duration determined by the RC time constant and voltage level of controlled power source 1750 output 1743. Note that the switch and RC circuit coupled to the Reset input of the D flip flop may be viewed as an edge triggered one shot, where as with the addition of the pulse generator 1745, this may be viewed as an edge triggered and re-trigger-able one shot. Those of ordinary skill will appreciate that various circuit architectures can be utilized to perform the functions of the pulse generator.

Thus in the sequencer using the optional pulse generator 1745, the sequencer can be configured to provide the sequencer output in the OFF state when the filter output as modified by or in accordance with the second feedback signal 1714 corresponds to a predetermined state (the clock level for the D flip flbp) and to provide the sequencer output in the ON state after a time lapse that is variable and that corresponds to the minimum time duration starting at the last occurrence of the predetermined state. As noted above, the sequencer is configured to provide the sequencer output asynchronously, i.e., the sequencer is clocked by the combiner output, i.e., loop filter output as modified by the second feedback signal or the control loop may be viewed as self clocked. Note that the sequencer may also be viewed as clocked by various signals, e.g. the output signal (drain voltage) as that ultimately determines the filter output signal, for a given input signal.

In one or more alternative embodiments (not specifically depicted) the voltage level at 1743 or another signal can be used to vary the sequencer output state and thus the operation of the radio frequency power amplifier of FIG. 17. For example, if the voltage level at 1743 or another signal is used to control a switch which adds an additional capacitor in parallel with capacitor 1739, the duration of the OFF state can be controlled. For example, suppose the envelope detector 141 monitors the input signal and when an envelope level of around 20% or less of the peak envelope is detected, the envelope detector or functionality responsive thereto can operate a switch. The switch can be configured to add an additional capacitor in parallel with capacitor 1739. If the additional capacitor had a capacitance that was, e.g., 2 times that of capacitor 1739, the time constant would be about 3 times the initial time constant and this would extend the OFF state to approximately 3 times the original. The net result is the duty cycle of the switching stage is reduced when signal levels are low, the current in the feed inductor is reduced, and this ultimately results in reducing power consumption of the switching stage.

Generally the elements of the controlled supply 111 have been discussed and described with reference to one or more other FIGs, e.g., FIG. 1, etc. and thus will not be repeated here.

It will be appreciated that the sequencer in one or more embodiments provides a sequencer output, which is switching essentially at the carrier frequency and the sequencer output has an average frequency that is equivalent to a carrier frequency of the output signal or desired output signal. If the input signal has already been frequency translated to the carrier frequency, the average frequency will correspond to the average frequency of the input signal. Furthermore, the sequencer output is suitable for driving the radio frequency gain stage so as to replicate amplitude and phase modulation corresponding to the input signal. Basically the sequencer is operating such that the sequencer output corresponds to or drives an RFGS or switching stage to generate a carrier signal as modulated by the input signal 1705. The sequencer as variously noted is self clocked or asynchronous, i.e., clocked in accordance with triggering events supplied by the feedback control system(s), which triggering events are based on an error signal, which can be a difference between the input signal and feedback signal as processed by the feedback control system (filtering, sequencer feedback, etc.). Generally various embodiments of the sequencer have some form of a hold off mechanism, such that the sequencer only changes states or only makes some state transitions in accordance with some rule, e.g., at a maximum rate. The sequencer only has an opportunity to make a decision and provide some output or change some output at finite times determined by the hold off methodology. From the above discussions, when the OFF state has a minimum duration this represents one hold off mechanism and limits the rate at which the sequencer output can change. The sequencer can be viewed as selecting a waveform responsive to the triggering event, where the event determines when the waveform begins and, subject to the hold off scheme, another triggering event determines the end of the waveform. Thus the sequencer is selecting waveforms at finite times determined by the sequencer input (triggering events) and the structure of these waveforms (amplitude, beginning, end, shape, etc) can be a function of or determined by the sequencer input and subject, typically, to some hold off mechanism.

Figure 19:
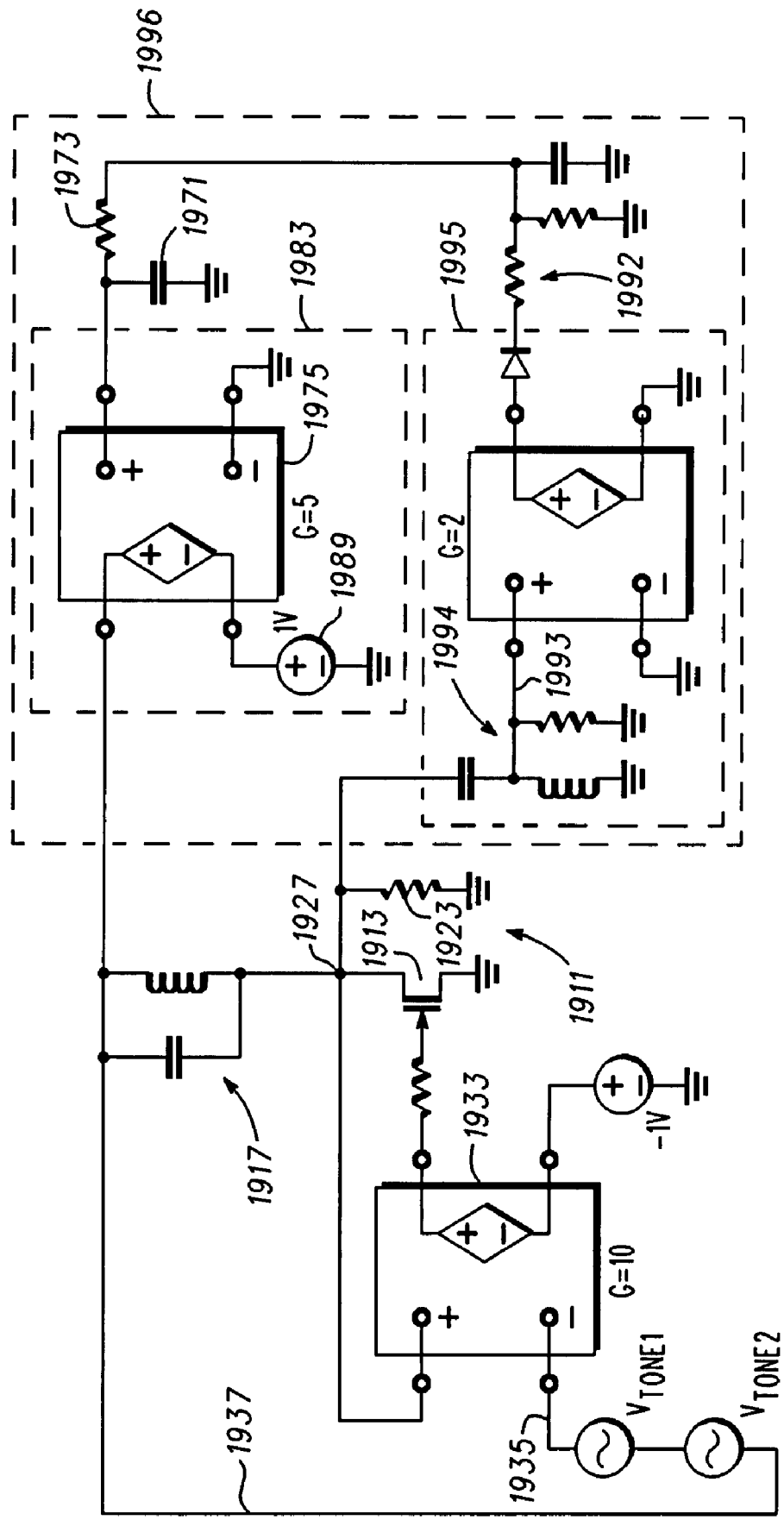
FIG. 19 shows a simplified model of one embodiment of a radio frequency power amplifier similar to that shown in FIG. 6; and FIG. 20A

Referring to FIG. 19, a simplified model of one embodiment of a radio frequency power amplifier, which is similar to that shown in FIG. 6 will be discussed and described. Power Amplifier 1911 comprises a common-source field effect transistor 1913 as the RFGS for the model, resistive load 1923 and resonant coupling to a variable power supply. It will be evident to those skilled in the art that each of these elements may be elaborated, with pre-drivers, coupling and matching networks and other well-known elements, or that different types of transistor or resonator may be used; but this circuit represents the essential core of a typical power amplifier.

The circuit is shown with components scaled for operation at a 1 Hz carrier frequency with a 10 Ohm load 1923. This carrier frequency and load resistance are not practical values, however, scaling the circuit to a desired carrier frequency and load are known art in radio-frequency circuit design.

Resonant choke 1917 shows a particular feature or value when power supply voltages are varied, namely that the coupling between variable power supply and the power amplifier can advantageously be designed as a filter that rejects power-supply energy in the signal band of interest: in this case the choke is resonated at the carrier frequency to provide a second-order notch. Thus the choke 1917 or filter rejects undesired energy associated with the power, i.e. energy that is within the bandwidth of the signal of interest. This embodiment shows resonant choke 1917 designed with a very wide relative bandwidth (quality factor "Q", in the standard terminology) to simplify understanding of circuit operation.

Load resistor 1923 is shown coupled directly to the amplifier drain; in a practical realization it would be AC-coupled and heavily filtered, but in the interests of clarity we show the simplest possible connection.

Loop filter 603 (see FIG. 6) comprises elements operating as part of a first feedback loop to linearize the amplifier's input-output response and components operating as part of a second loop to manage controlled power source 1983. In this simplified case the filtering function or loop filter 603 is simplified to be "infinitely" wideband (see 50 ohm resistor at the gate of RFGS 1913), again for clarity, but those skilled in the art of systems control will recognize that it is usually desirable that the feedback loop implement a bandpass filter centered on the carrier or signal of interest.

The error signal used to linearize the input-output response of the radio frequency power amplifier is derived at the input to voltage controlled voltage source 1933, where the input signal 1935 (sum of two tones for the model) is compared to output signal 1927. Note that the absence of conventional AC coupling or load resistor 1923 (as described above) requires that the input signal be taken relative to the variable power supply 1937. In practice, this method of deriving the input signal is not a desirable feature, but simplifies the circuit for clarity.

The circuitry described above operates, with a sufficiently high fixed power supply level at 1937, as a feedback-linearized power amplifier. Those skilled in the art will recognize that such architectures as Cartesian and polar feedback amplifiers may be used in practice. One novel element of this invention is the addition of a closed-loop power-supply control or controlled supply 1996 operable to improve power efficiency, reduce heat generation, and improve reliability for a given power level and linearity.

The first element of power-supply control loop or controlled supply 1996 may be viewed as a portion of the controller 619 (see FIG. 6) and comprises a detector or subsystem 1995 operable to detect the presence of third-harmonic power in the output signal. The presence of third-harmonic power in the output signal is an indicator of the onset of "clipping" from low power supply, but may be tolerated in small quantities.

Resonant circuit 1994 (an R, L, C circuit) is configured to resonate at the third harmonic of the desired carrier signal, providing an error voltage at node 1993. It will be appreciated that this corresponds to a loop error signal 1993 (e.g., the middle output 607 of the loop filter 603 in FIG. 6), with the practical simplification that it is not necessary to subtract the power amplifier output from the input signal in this case because it is assumed that the desired input signal and thus desired output signal 1927 has zero power at the third harmonic. In other words loop error signal 1993 is equivalent to the signal at the output of voltage controlled voltage source 1933 with an appropriate filter. Thus loop error signal 1993 is an error signal that is based on a combination of the input signal 1935 and the feedback signal 1927. A designer skilled in the art will recognize that this circuit also acts as a "trap", reducing the undesirable third-harmonic power at the output, and that traps and sensors for other harmonics may be substituted. The error signal 1993 is coupled to detector circuit 1992.

Detector circuit 1992 (the voltage controlled voltage source, diode, 50 Ohm resistor, 10 k leak resistor, 1 mF memory capacitor) estimates the magnitude of the third-harmonic error. Although detector circuit 1992 is a type of envelope detector, it is responsive to output error rather than input signal as is the case in prior art. In the embodiment described here, the designer calculates the level of third-harmonic power appearing in the trap that corresponds to an acceptable level of distortion in the overall amplifier and makes this the "setpoint" of the power-supply control loop. It will be appreciated that there is a relationship among the measured third-harmonic power, the level of undesirable third-order intermodulation products in-band, and the amount of feedback gain in the linearization loop that allows specifications on third-order intermodulation to be mapped into a calculated third-harmonic signal level. In this embodiment the "setpoint" is approximately 0.7 V, the turn-on voltage of the diode of detector circuit 1992. The detector is configured to provide an error signal that is indicative of a difference between power or voltage being supplied and an appropriate or desired level for the power or voltage. Thus in this embodiment the detector is configured to provide an error signal that corresponds to a harmonic ($3^{rd}$ order) level where this harmonic level is indicative of a present level of power being provided to the amplifier relative to a desired level of the power.

The resonant circuit 1994, detector circuit 1992, RC filter (capacitor 1971 and resistor 1973), and controlled power source 1983 (excluding voltage source) form the controller (see FIG. 6, 619) for the controlled supply 2196 in this simplified embodiment. Controlled power source 1983, specifically the voltage source portion of voltage controlled voltage source 1975 is responsive to the output of this controller and doubles as or represents the controlled power source (see FIG. 6, 623) and provides a controlled power or voltage at 1937. These elements perform filtering, differencing from a reference, gain and addition of an offset voltage—all functions that will be familiar to a designer of analog circuits for control purposes and all of which may take multiple variant forms. Offset voltage 1989 operates to ensure that a minimum output voltage of 1V appears on the output of controlled power source 1983, so that the amplifier is never turned entirely off; as allowing it to turn off completely would also turn off generation of the third-harmonic signal needed to operate the loop.

Figure 20A:
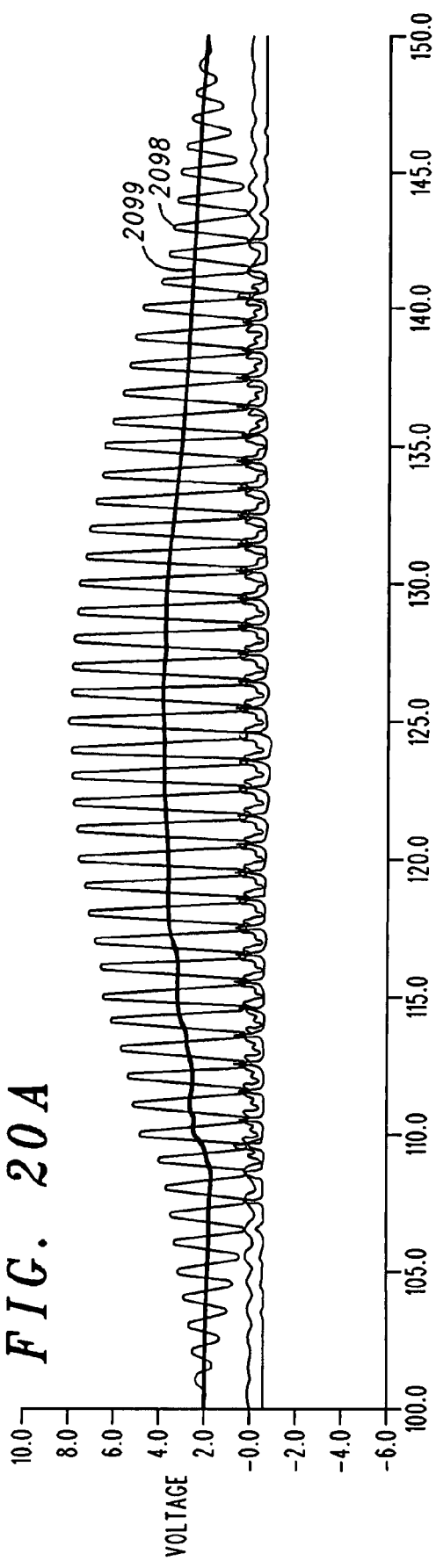
FIG. 20B shows various signals from simulation of the FIG. 19 model.
Figure 20B:
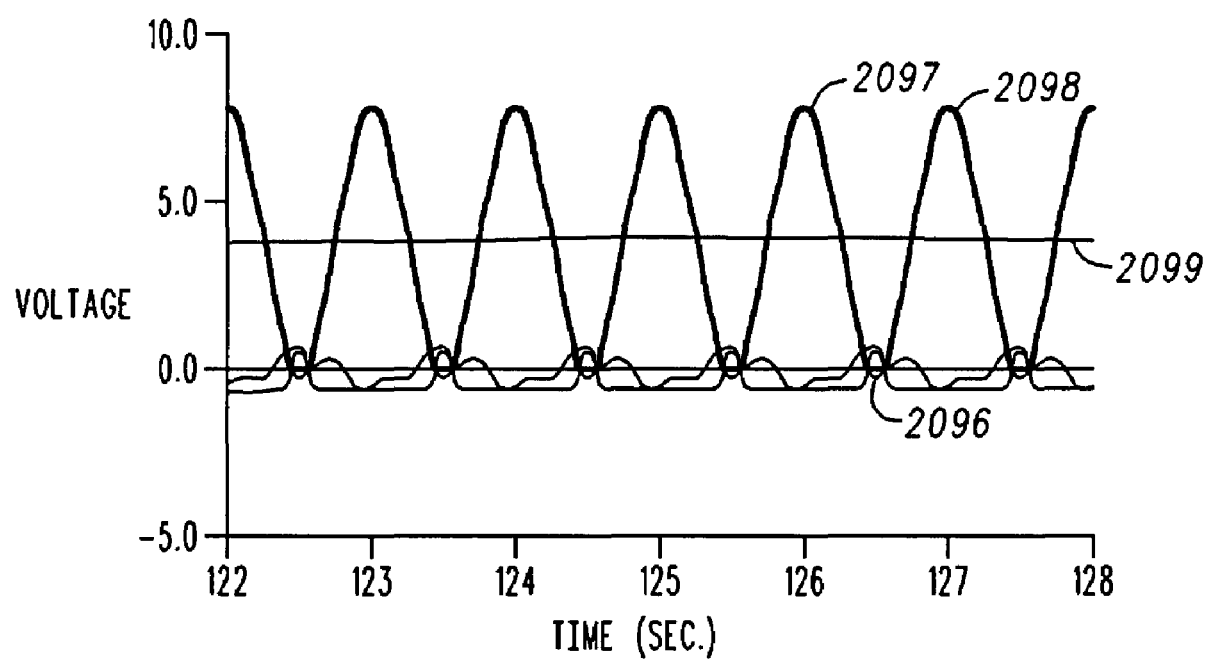

FIG. 20A shows the operational characteristics of this embodiment, with voltage on the vertical axis and time on the horizontal axis. Curve 2099 is the controlled voltage at 1937 and can be seen to rise and fall with the level of input signal 1935 as reflected by curve 2298. FIG. 20B shows in greater detail a portion (between time equal to 122 and 128) of FIG. 20A, i.e., operation at high input levels. It can be seen that the output signal at 1927 (curve 2097) closely tracks (overlays and replicates) input signal 1935 (curve 2098), except for a small portion 2096 where the output signal is clipped at zero. This constitutes the allowable distortion for which the loop was designed. Note that the power supply voltage 1937 is at 4V in this condition, which is the minimum for this amplifier to reproduce the 2V peak sinusoidal input signal. The power control loop can thus be seen to have successfully minimized the controlled power or voltage level for the signal level and linearity required, which in turn means that it has maximized efficiency for this type of power amplifier 1911 and minimized heating of transistor 1913

The processes, apparatus, and systems, discussed above, and the inventive principles thereof are intended to and can alleviate problems caused by prior art radio frequency power amplifiers. Using these principles of defining/providing a radio frequency gain stage with a resonant load and managing or controlling operation thereof using a feedback control loop or system in addition to a controlled power supply and in some embodiments a second feedback system can simplify faithfully reproducing complex modulation with such radio frequency gain stages and also allow for improved amplifier efficiencies, size and costs. Using the above noted principles and concepts allows the use of less capable stages (lower costs) as well as facilitates the use of alternative stages from alternative manufacturers of such devices with limited if any change to the radio frequency power amplifier. This is expected to reduce "costs" (economic, size, weight, life expectancy, power consumption, etc.) associated with radio frequency power amplifiers in present and future communication systems and thus facilitate connectivity for users of such systems.

One of the principles used is to control switching times given the switching stage, accompanying resonant load, and specifics of a radio frequency signal with complex modulation, such that on average the switching occurs at or near a voltage minimum across the switching stage. Using the controlled power supply and other techniques as above described is beneficial in improved efficiency and often linearity for a given RFGS. This dramatically reduces power dissipation in and thus increases efficiency of the resultant radio frequency power amplifier. Various embodiments of methods, systems, and apparatus for effecting control of switching stages so as to facilitate and provide for faithful complex modulation of resultant radio frequency power amplifier output signals in an efficient manner have been discussed and described. It is expected that these embodiments or others in accordance with the present invention will have application to many communication networks. Using the inventive principles and concepts disclosed herein advantageously facilitates communications using linear complex modulation which will be beneficial to users and providers a like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A radio frequency power amplifier comprising:
    a feedback control system coupled to an input signal and a first feedback signal and configured to provide a sequencer output, the sequencer output comprising waveforms occurring at an average frequency in accordance with a radio frequency with timing determined by the feedback control system, the feedback control system further comprising a loop filter with a pass band that is arranged to pass the input signal;
    a controlled supply configured to provide power that is controlled in accordance with the input signal; and
    a radio frequency gain stage powered from the controlled supply, driven by the sequencer output, and configured to provide an output signal at the radio frequency, the output signal including an amplified version of the input signal as filtered by the loop filter, the first feedback signal corresponding to the output signal.

2. The radio frequency amplifier of claim 1 wherein the controlled supply is further configured to provide the power at a level in accordance with an envelope of the input signal.

3. The radio frequency amplifier of claim 1 wherein the controlled supply is further configured to provide the power at one of a plurality of discrete levels, with the one of the plurality of discrete levels selected in accordance with the input signal.

4. The radio frequency amplifier of claim 1 wherein the controlled supply is further configured to provide the power in accordance with an error signal that is based on the input signal and the first feedback signal.

5. The radio frequency amplifier of claim 1 wherein the controlled supply is further configured to provide the power at a level in accordance with an envelope of the input signal and in accordance with an envelope of an error signal that is based on the input signal and the first feedback signal.

6. The radio frequency amplifier of claim 1 wherein the controlled supply is further configured to provide the power in accordance with one or more of: an error signal that is based on the input signal and the first feedback signal; the error signal as processed by the feedback control system; and state changes in one of the error signal as processed and the sequencer output.

7. The radio frequency amplifier of claim 1 wherein the controlled supply is further configured to provide power having a plurality of signals and wherein the radio frequency gain stage comprises a plurality of radio frequency gain stages, each coupled to one of the plurality of signals.

8. The radio frequency amplifier of claim 7 wherein one of the plurality of signals is used to control a bias level for at least one of the plurality of radio frequency gain stages.

9. The radio frequency amplifier of claim 1 wherein the controlled supply is further configured to provide a plurality of signals with at least one of the plurality of signals coupled to the feedback system and used to control a phase associated with an error signal as processed by the feedback control system.

10. The radio frequency amplifier of claim 1 wherein the controlled supply is further configured to provide a plurality of signals with at least one of the plurality of signals coupled to the feedback system and used to control a characteristic of the sequencer output.

11. The radio frequency amplifier of claim 1 further comprising a second feedback system responsive to the sequencer output and configured to provide a second feedback signal that is coupled to the feedback control system; and wherein the controlled supply is further configured to provide a plurality of signals with at least one of the plurality of signals coupled to the second feedback system and used to control a characteristic of the second feedback signal.

12. The radio frequency amplifier of claim 1 further comprising:
    an amplitude control means coupled to the output signal and configured to limit an amplitude of the output signal; and
    wherein the controlled supply is further configured to provide a plurality of signals with at least one of the plurality of signals coupled to the amplitude control means and used to control a level at which the amplitude control means is configured to limit the amplitude of the output signal.

13. The radio frequency amplifier of claim 1 wherein the controlled supply further comprises:

a controller for processing a controller input signal and providing a controller output signal; and a controlled power source responsive to the controller and configured to provide the power.

14. The radio frequency amplifier of claim 13 wherein the controlled power source includes a linear regulator.

15. The radio frequency amplifier of claim 13 wherein the controlled power source includes a switching regulator that is synchronously clocked in accordance with a clock.

16. The radio frequency amplifier of claim 13 wherein the controlled power source includes a switching regulator that is asynchronously clocked.

17. The radio frequency amplifier of claim 13 wherein the controller further comprises a signal conditioner coupled to the controller.

18. The radio frequency amplifier of claim 13 wherein the controller further comprises a signal conditioner configured to provide the controller input signal, the controller input signal including an envelope signal having an amplitude limited by the signal conditioner.

19. The radio frequency amplifier of claim 13 wherein the controller further comprises a signal conditioner configured to provide the controller input signal, the controller input signal including an envelope signal having an offset added by the signal conditioner.

20. A radio frequency power amplifier comprising:
a feedback control system coupled to an input signal and a first feedback signal and configured to provide a control signal;
a controlled supply configured to provide power, the power controlled in accordance with an error signal based on a combination of the input signal and the first feedback signal;
a radio frequency gain stage using the power from the controlled supply, driven by the control signal, and configured to provide an output signal, the first feedback signal corresponding to the output signal; and
a filter, wherein the power is coupled to the radio frequency rain stage through the filter, the filter rejecting undesired enemy that is associated with the power.

21. The radio frequency power amplifier of claim 20 further comprising a detector configured to provide the error signal, the error signal indicative of a difference between the power and desired power.

22. The radio frequency power amplifier of claim 20 further comprising a detector configured to provide the error signal, the error signal corresponding to a harmonic level, the harmonic level indicative of present level of the power relative to a desired level of the power.

23. The radio frequency power amplifier of claim 20 further comprising an envelope detector configured to provide an envelope signal corresponding to an envelope of the input signal, the envelope signal coupled to the controlled supply and used to establish an initial power level.

24. The radio frequency power amplifier of claim 20 further comprising an envelope detector configured to provide an envelope signal corresponding to an envelope of the input signal, the envelope signal coupled to the controlled supply and used to bias a power level in a direction of change of the envelope signal.

25. The radio frequency power amplifier of claim 20, wherein the feedback control system is configured to provide the error signal, the error signal corresponding to a difference between the input signal and the feedback signal.

26. The radio frequency power amplifier of claim 25, wherein the feedback control system is configured to provide the error signal, the error signal corresponding to a difference between the input signal and the feedback signal as filtered by a loop filter.

27. The radio frequency power amplifier of claim 20, wherein the controlled supply is further configured to provide power having a plurality of signals and wherein the radio frequency gain stage comprises a plurality of radio frequency gain stages, each coupled to one of the plurality of signals.

28. The radio frequency amplifier of claim 27 wherein one of the plurality of signals is used to control a bias level for at least one of the plurality of radio frequency gain stages.

29. The radio frequency power amplifier of claim 20, wherein the feedback control system further comprises a sequencer and the control signal is a sequencer output, the sequencer output having an average frequency that is equivalent to a carrier frequency of the output signal and suitable for driving the radio frequency gain stage to replicate amplitude and phase modulation corresponding to the input signal.

30. The radio frequency power amplifier of claim 29 wherein the feedback control system is configured to provide the error signal, the error signal corresponding to a difference between the input signal and the feedback signal.

31. The radio frequency amplifier of claim 29 wherein the controlled supply is further configured to provide the power in accordance with one or more of: the error signal as processed by the feedback control system; and state changes in one of the error signal as processed and the sequencer output.

32. The radio frequency amplifier of claim 29, wherein the feedback control system is configured to provide the error signal, the error signal corresponding to one or more of pulse lengths and occurrence rates at the sequencer output.

33. The radio frequency power amplifier of claim 29, wherein the feedback control system is configured to provide the error signal, the error signal corresponding to a phase change between an input to the sequencer and a preceding sequencer output.

34. A radio frequency power amplifier comprising:
a loop filter with an input coupled to a signal that is based on an input signal and a feedback signal, the loop filter having a pass band for passing the signal;
a sequencer responsive to a filter output from the loop filter and configured to provide a sequencer output, where the sequencer output has an OFF state with a starting time that corresponds to the filter output, the OFF state having a predetermined duration;
a radio frequency stage driven by the sequencer output and configured to provide an output signal that is an amplified version of the input signal as filtered by the loop filter, the feedback signal corresponding to the output signal; and
a controlled supply configured to provide power to the radio frequency stage, wherein the power is controlled in accordance with amplitude variations of the input signal.

* * * * *

UNITED STATES PATENT AND TRADEMARK OFFICE
CERTIFICATE OF CORRECTION

| | | |
|---|---|---|
| PATENT NO. | : 7,474,149 B2 | Page 1 of 1 |
| APPLICATION NO. | : 11/818925 | |
| DATED | : January 6, 2009 | |
| INVENTOR(S) | : Snelgrove et al. | |

It is certified that error appears in the above-identified patent and that said Letters Patent is hereby corrected as shown below:

Column 35 line 39 please delete "rain" and insert --gain--
Column 35 line 40 please delete "enemy" and insert --energy--

Signed and Sealed this

Fourteenth Day of April, 2009

JOHN DOLL
*Acting Director of the United States Patent and Trademark Office*